US009437773B2

(12) United States Patent
Ito

(10) Patent No.: US 9,437,773 B2
(45) Date of Patent: Sep. 6, 2016

(54) SEMICONDUCTOR LIGHT-EMITTING ELEMENT AND MANUFACTURING METHOD FOR THE SAME

(71) Applicant: ROHM CO., LTD., Kyoto-shi, Kyoto (JP)

(72) Inventor: Yohei Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/548,534

(22) Filed: Nov. 20, 2014

(65) Prior Publication Data

US 2015/0137170 A1    May 21, 2015

(30) Foreign Application Priority Data

Nov. 21, 2013  (JP) ................................ 2013-240873
Oct. 8, 2014   (JP) ................................ 2014-207028

(51) Int. Cl.
| H01L 33/00 | (2010.01) |
| H01L 23/00 | (2006.01) |
| H01L 33/38 | (2010.01) |
| H01L 33/42 | (2010.01) |

(52) U.S. Cl.
CPC ........... *H01L 33/0095* (2013.01); *H01L 24/83* (2013.01); *H01L 24/94* (2013.01); *H01L 24/97* (2013.01); *H01L 33/0079* (2013.01); *H01L 33/387* (2013.01); *H01L 33/42* (2013.01); *H01L 2933/0016* (2013.01)

(58) Field of Classification Search
CPC ..... H01L 33/62; H01L 33/0095; H01L 24/83; H01L 24/94; H01L 24/97; H01L 33/0079; H01L 33/387; H01L 33/42; H01L 2933/0016
See application file for complete search history.

(56) References Cited

U.S. PATENT DOCUMENTS

| 8,368,103 | B2 * | 2/2013 | Shinohara et al. ............. 257/98 |
| 9,006,792 | B2 * | 4/2015 | Haruta ........................... 257/200 |
| 2008/0173885 | A1 | 7/2008 | Kuromizu | |
| 2012/0273823 | A1 * | 11/2012 | Yoneda et al. .................. 257/98 |
| 2013/0320381 | A1 * | 12/2013 | Kojima ................ H01L 33/486 257/98 |

FOREIGN PATENT DOCUMENTS

JP    2007-221029    8/2007

* cited by examiner

*Primary Examiner* — Fernando L Toledo
*Assistant Examiner* — Neil Prasad
(74) *Attorney, Agent, or Firm* — Hamre, Schumann, Mueller & Larson, P.C.

(57) ABSTRACT

A semiconductor light-emitting element includes a substrate, a first metal layer, a second metal layer, a translucent conductive layer, and a semiconductor layer with a light-emitting region. The translucent conductive layer includes an end face intersecting a plane orthogonal to the thickness direction of the substrate. The substrate includes an end face intersecting a plane orthogonal to the thickness direction. The end face of the translucent conductive layer is located inwardly of the end face of the substrate as viewed in the thickness direction.

12 Claims, 31 Drawing Sheets

SEMICONDUCTOR LIGHT-EMITTING ELEMENT AND MANUFACTURING METHOD FOR THE SAME

BACKGROUND OF THE INVENTION

1. Field of the Invention

The present invention relates to a semiconductor light-emitting element and a manufacturing method for the same.

2. Description of Related Art

Semiconductor light-emitting elements such as LEDs and semiconductor lasers are widely used as high-intensity light sources that are power efficient. There are semiconductor light-emitting elements in which a translucent conductive layer that has translucency and conductivity is provided between a reflective metal layer and a semiconductor layer that includes a light-emitting region, in order to achieve high intensity. A known configuration equipped with such a translucent conductive layer is a semiconductor light-emitting element having an ODR structure (see JP-A-2007-221029, for example). A semiconductor light-emitting element having an ODR structure is constituted such that a semiconductor layer and a metal layer are in conduction, by providing a translucent insulating layer (insulating material part) consisting of $SiO_2$ or the like between a reflective metal layer and a semiconductor layer that includes a light-emitting region, and providing an ohmic electrode (metal material part) in a portion of the insulating layer. Such a configuration is suitable for achieving high intensity because of the improvement in the reflectance of the metal layer and the fact that light generated inside the semiconductor light-emitting element can be efficiently extracted to the outside.

However, there is a problem with semiconductor light-emitting elements having an ODR structure in that the $SiO_2$ (insulating material part) tends to separate from the metal layer when forming chips by dicing in the manufacturing process. This is thought to be caused by factors such as the low adhesion force of the insulating material part to the metal layer, and the metal curling up off the cut surface of the metal layer when the insulating material part and the metal layer are cut at the time of dicing, resulting in a force that acts to exfoliate the insulating material part formed on this metal layer.

SUMMARY OF THE INVENTION

The present invention has been proposed under the above circumstances, and has an object to provide a semiconductor light-emitting element having a translucent conductive layer between a semiconductor layer and a metal layer in which exfoliation of the translucent conductive layer from the metal layer when forming chips can be prevented, and a manufacturing method for the same.

According to a first aspect of the present invention, there is provided a semiconductor light-emitting element that includes: a substrate; a first metal layer supported by the substrate; a second metal layer supported by the substrate; a translucent conductive layer supported by the substrate; and a semiconductor layer supported by the substrate and including a light-emitting region. The translucent conductive layer includes an end face that intersects a plane orthogonal to a thickness direction of the substrate, and the substrate also includes an end face that intersects a plane orthogonal to the thickness direction. The end face of the translucent conductive layer is located inwardly of the end face of the substrate as viewed in the thickness direction.

According to a second aspect of the present invention, there is provided a method for manufacturing a semiconductor light-emitting element, where the method includes: a step of forming, on a semiconductor layer formed on a growth substrate and including a light-emitting region, a plurality of translucent conductive layers in positions separated from each other, while also forming a second metal layer that covers at least a portion of each of the translucent conductive layers; a step of joining the second metal layer and a first metal layer formed on a support substrate; a step of removing the growth substrate; and a step of cutting the first metal layer and the support substrate in a thickness direction of the support substrate, at a position that avoids the translucent conductive layer.

Other features and advantages of the present invention will become more apparent from detailed description give below with reference to the accompanying drawings.

DETAILED DESCRIPTION OF THE PREFERRED EMBODIMENTS

Preferred embodiments of the present invention will be described below with reference to the accompanying drawings.

Figure 1:
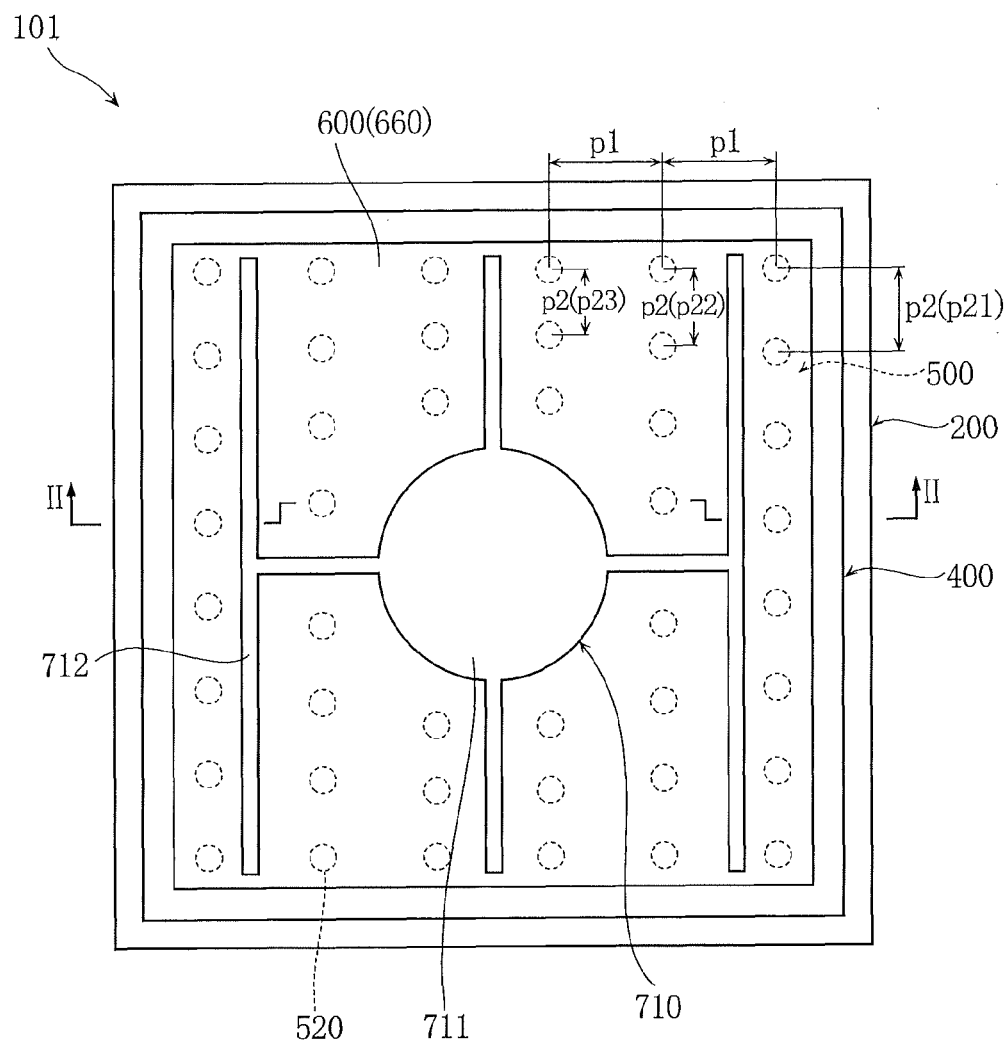
FIG. 1 is a plan view showing a semiconductor light-emitting element according to a first embodiment of the present invention.
Figure 2:
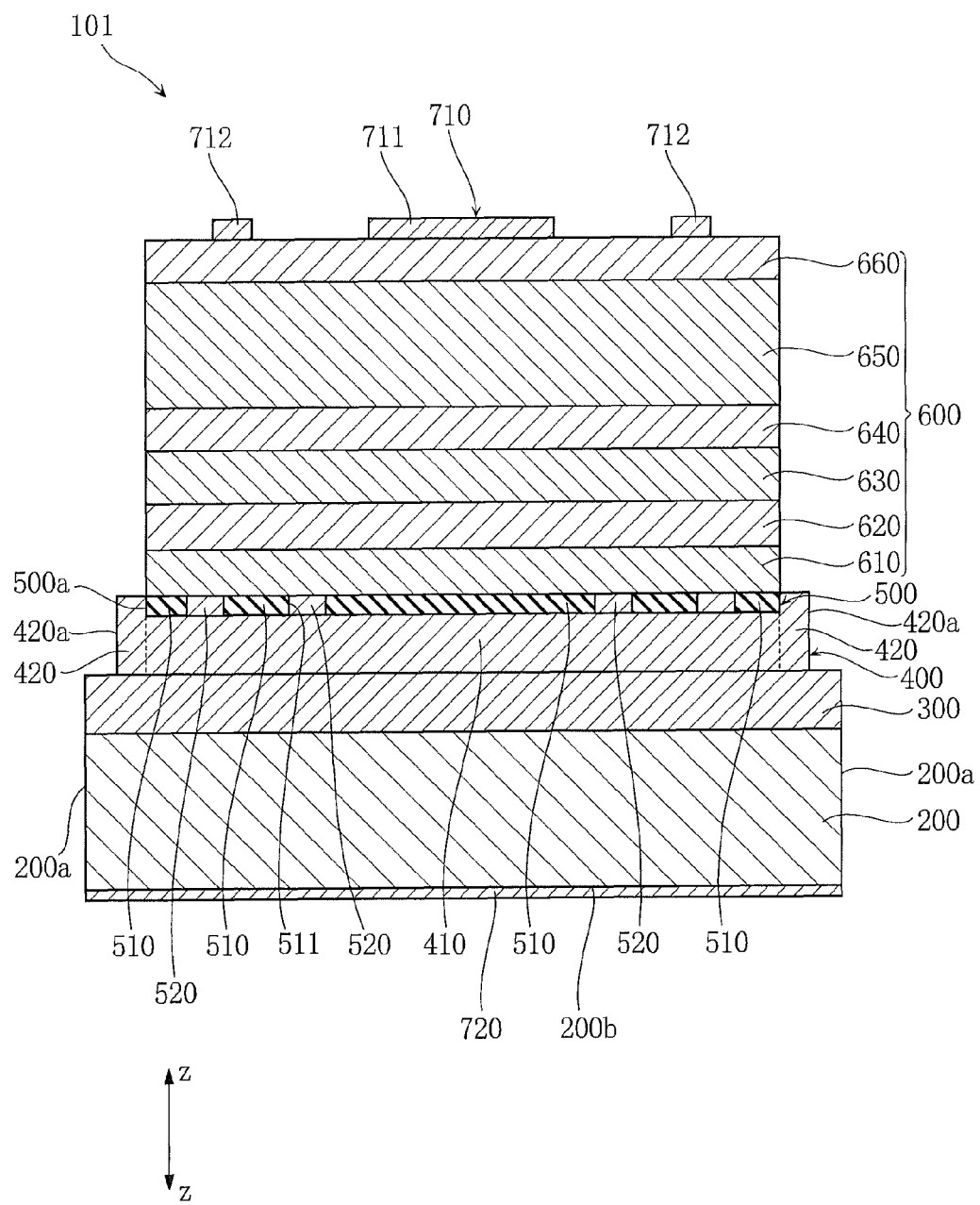
FIG. 2 is a cross-sectional view along a line II-II in FIG. 1.

FIG. 1 and FIG. 2 show a semiconductor light-emitting element according to a first embodiment of the present invention. A semiconductor light-emitting element 101 of the present embodiment is provided with a substrate 200, and a first metal layer 300, a second metal layer 400, a translucent conductive layer 500, a p-type contact layer 610, a p-type cladding layer 620, an active layer 630, an n-type cladding layer 640, an n-type window layer 650 and an n-type contact layer 660 that are laminated sequentially on the substrate 200. A surface electrode 710 is formed on the n-type contact layer 660, and a back electrode 720 is formed in the back surface of the substrate 200. The p-type contact layer 610, the p-type cladding layer 620, the active layer 630, the n-type cladding layer 640, the n-type window layer 650 and the n-type contact layer 660 constitute a semiconductor layer 600.

The substrate 200 is constituted by a semiconductor material such as gallium arsenide (GaAs), for example. As shown in FIG. 2, in the substrate 200, an end face 200a (outer peripheral surface of the substrate 200 as viewed in a thickness direction z) that intersects a plane which is orthogonal to the thickness direction z is rectangular in shape. As will be discussed in detail later, the end face 200a of the substrate 200 is constituted by a cut surface formed by dicing across an entire area of the end face in the thickness direction z. Note that the substrate 200 can be constituted by materials other than GaAs, such as silicon, SiC or GaP.

The first metal layer 300 consists of Au or an alloy containing Au, and is, for example, constituted) by laminating a plurality of layers consisting of Au or an Au alloy. The first metal layer 300 is formed on the substrate 200.

The second metal layer 400 is a reflective metal layer having high reflectivity, and consists of Au or an alloy containing Au, for example. Also, the second metal layer 400 may have a structure obtained by laminating a plurality of layers consisting of Au or an Au alloy. In the case where the second metal layer 400 has a laminated structure consisting of a plurality of layers, a laminated structure consisting of AuBeNi/Au or AuBeNi/Au/Mo/Au can be employed. In the case of the laminated structure consisting of AuBeNi/Au, the AuBeNi layer has a thickness of about 2,000 Å and the Au layer has a thickness of about 14,000 Å, for example. Also, in the case of the laminated structure consisting of AuBeNi/Au/Mo/Au, the AuBeNi layer has a thickness of about 2,000 Å, the Au layer has a thickness of about 4,000 Å, the Mo layer has a thickness of about 2,000 Å, and the Au layer has a thickness of about 15,000 Å. In the present embodiment, the second metal layer 400 is constituted by being provided with a laminated part 410 and an extended part 420. The laminated part 410 overlaps with the translucent conductive layer 500 as viewed in the thickness direction z. The extended part 420 is connected to an outer peripheral portion of the laminated part 410, and extends on the translucent conductive layer 500 side in the thickness direction z. Note that although a clear boundary does not exist between the laminated part 410 and the extended part 420, the boundary between the laminated part 410 and the extended part 420 is represented with a dashed line in FIG. 2 (the same applies to FIGS. 14, 24 and 33 discussed later) for convenience of understanding.

In the present embodiment, the outer peripheral surface 420a of the extended part 420 (in the extended part 420, the end face that intersects a plane which is orthogonal to the thickness direction z) is located more inwardly than the end face 200a of the substrate 200 as viewed in the thickness direction z. The outer peripheral surface 420a of the extended part 420 is flat in the thickness direction z.

The translucent conductive layer 500 is a layer having translucency and conductivity, and is formed on the second metal layer 400 (laminated part 410). In the present embodiment, the translucent conductive layer 500 is constituted to include an insulating material part 510 and metal material parts 520, and has an ODR structure.

The insulating material parts 510 are constituted by an insulating material having translucency but not conductivity, and consists of $SiO_2$, for example. The insulating material part 510 can be constituted by materials other than $SiO_2$, such as SiN or SiON. The insulating material part 510 is rectangular in shape as viewed in the thickness direction z, and a plurality of holes 511 that pass through in the thickness direction z are provided in appropriate places of the insulating material part 510.

The metal material parts 520 fill each of the plurality of holes 511 of the insulating material part 510, and are surrounded by the insulating material part 510 as viewed in the thickness direction z. The metal material parts 520 are for forming an ohmic contact between the second metal layer 400 and the p-type contact layer 610, and are interposed between the second metal layer 400 and the p-type contact layer 610. As a result of such a configuration, the back electrode 720 provided on a back surface 200b (surface on the opposite side to the semiconductor layer side) of the substrate 200 is in conduction with the p-type contact layer 610 (semiconductor layer 600) through the metal material parts 520 (translucent conductive layer 500). The metal material parts 520 consist of Au or an alloy containing Au, for example, and consist of the same metal material as the second metal layer 400. Note that although a clear boundary does not exist between the second metal layer 400 and the metal material parts 520, the boundary between the second metal layer 400 and the metal material parts 520 is represented with a solid line in FIG. 2 (also applies to FIGS. 5B to 9 disused below) for convenience.

As shown in FIG. 1, the metal material parts 520 are arrayed horizontally and vertically in plan view (as viewed in the thickness direction z). A pitch p1 of the metal material parts 520 that are adjacent to each other in the horizontal direction in the diagram (direction x) is greater than a pitch p2 of the metal material parts 520 that are adjacent to each other in the vertical direction in the diagram (direction y). Also, the pitch p2 of the metal material parts 520 that are adjacent to each other in the direction y decreases toward the center in the direction x. That is, the size relationship between pitches p21, p22 and p23 shown in FIG. 1 is p21>p22>p23.

In the translucent conductive layer 500, an end face 500a (outer peripheral surface of the translucent conductive layer 500 as viewed in the thickness direction z) that intersects a plane which is orthogonal to the thickness direction z is rectangular in shape. The end face 500a is located more inwardly than the end face 200a of the substrate 200 as viewed in the thickness direction z. Also, the end face 500a is covered by the extended part 420 of the second metal layer 400.

The p-type contact layer 610, the p-type cladding layer 620, the active layer 630, the n-type cladding layer 640, the n-type window layer 650 and the n-type contact layer 660 are laminated by epitaxy or the like.

The p-type contact layer 610 is constituted by GaP, for example, and has a thickness of about 900 μm. The p-type cladding layer 620 is constituted by AlInP, for example, and has a thickness of about 800 μm.

The active layer 630 is a layer having a MQW structure containing InGaP, and is equivalent to what is referred to in the present invention as a light-emitting region. The active layer 630 is formed by alternately laminating a plurality of InGaP layers and a plurality of AlGaInP layers. The InGaP layers constitute well layers of the active layer 630, and the AlGaInP layers constitute barrier layers of the active layer 630. The overall thickness of the active layer 630 is about 650 μm, for example.

The n-type cladding layer 640 is constituted by AlInP, for example, and has a thickness of about 800 μm. The n-type window layer 650 is constituted by $(Al_{0.7}Ga_{0.3})_{0.5}In_{0.5}P$, for example, and has a thickness of about 900 μm. The n-type contact layer 660 is constituted by $(Al_{0.5}Ga_{0.5})_{0.5}In_{0.5}P$, for example, and has a thickness of about 900 μm.

As shown in FIG. 1, the surface electrode 710 has a circular center electrode part 711 that is located at the center on the n-type contact layer 660 (semiconductor layer 600) as viewed in the thickness direction z, and linear electrode parts 712 that extend linearly and branched out from the center electrode part 711 as appropriate. The surface electrode 710 consists of Au or an alloy containing Au, for example. The back electrode 720 is formed across the entire back surface 200b of the substrate 200. The back electrode 720 consists of Au or an alloy containing Au, for example.

The semiconductor light-emitting element 101 shown in FIG. 1 has a rectangular outer shape in plan view (as viewed in the thickness direction z), and is, for example, square in shape with sides of about 310 μm.

Next, an exemplary method for manufacturing a semiconductor light-emitting element 101 will be described with reference to FIGS. 3 to 12.

Figure 3:
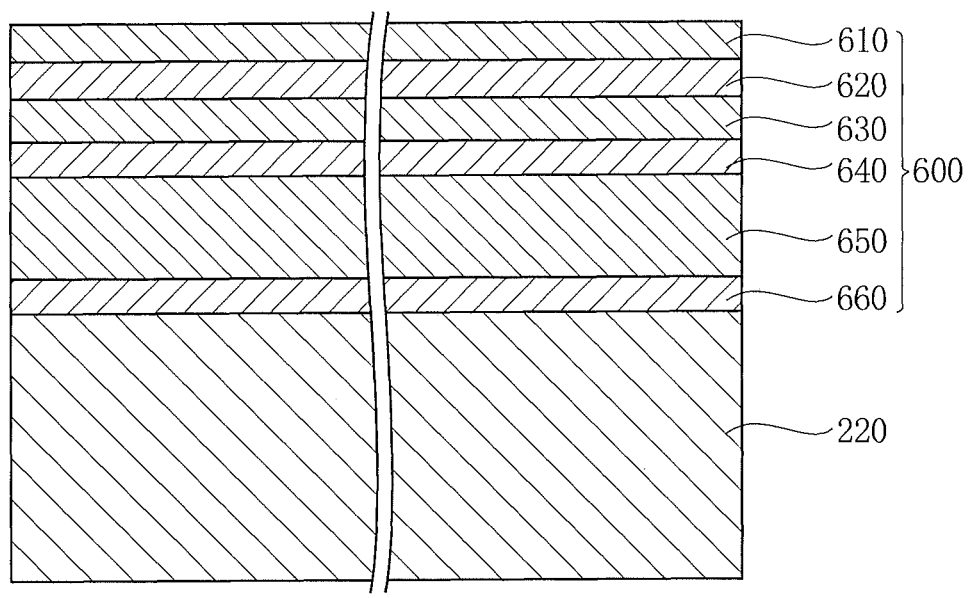
FIG. 3 is a cross-sectional view of a main section showing one process of a method for manufacturing a semiconductor light-emitting element according to the first embodiment of the present invention.

First, the n-type contact layer 660, the n-type window layer 650, the n-type cladding layer 640, the active layer 630, the p-type cladding layer 620 and the p-type contact layer 610 are sequentially laminated on a growth substrate 220 consisting of GaAs or the like, as shown in FIG. 3, using molecular beam epitaxy, MOCVD or the like. This results in the semiconductor layer 600 growing on the growth substrate 220.

Figure 4A:
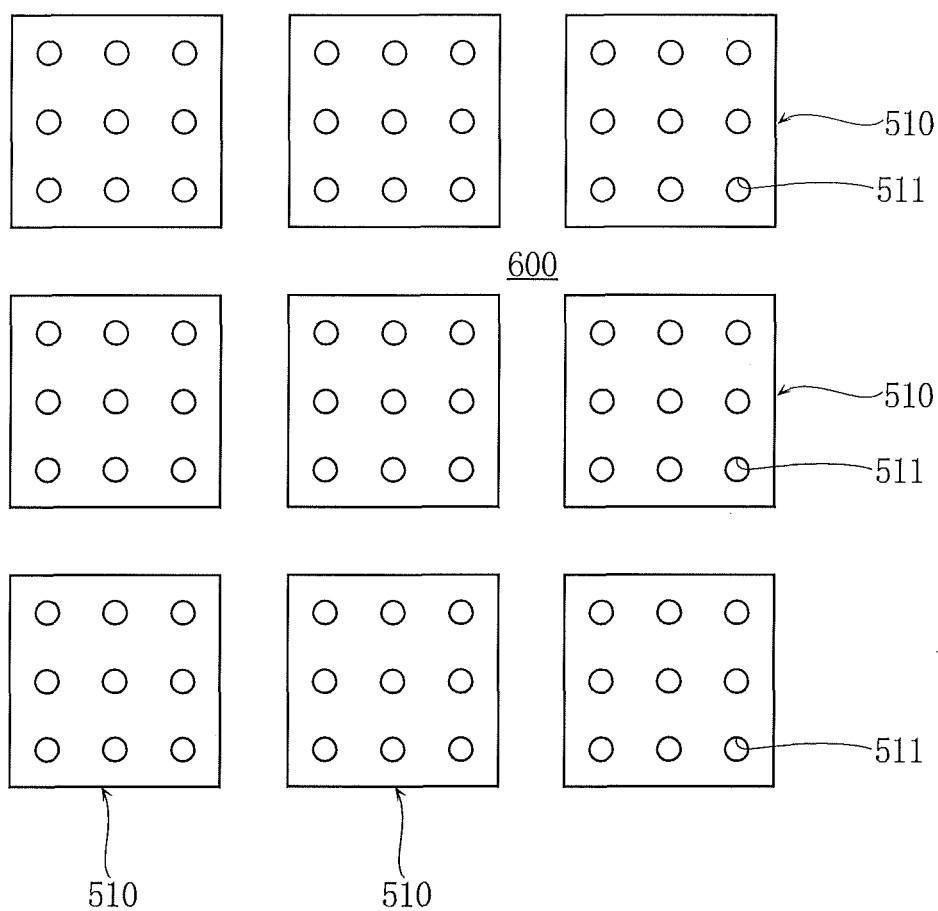
FIGS. 4A and 4B show one process of the method for manufacturing a semiconductor light-emitting element according to the first embodiment of the present invention, with FIG. 4A being a plan view of a main section and FIG. 4B being a cross-sectional view of a main section.
Figure 4B:
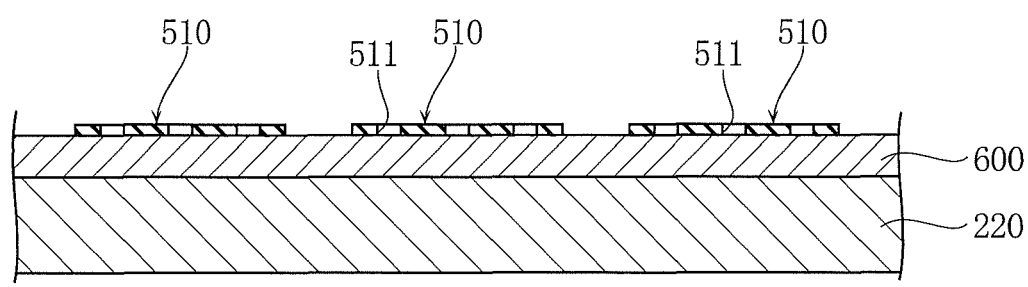

Next, as shown in FIG. 4, a plurality of insulating material parts 510 are formed on the semiconductor layer 600. Note that the semiconductor layer 600 is represented in simplified form in the diagrams illustrating the manufacturing method from FIG. 4 onward. In forming the insulating material parts 510, first an insulating material (e.g., $SiO_2$) having translucency and insulation properties is formed as a film on the semiconductor layer 600 by a CVD method or a sputtering method, and an insulating film (not shown) is formed. Next, using a photolithographic method, a photoresist is applied onto the insulating film, and exposure using a photomask having a predetermined pattern shape, etching, and resist removal are sequentially performed. A plurality of insulating material parts 510 are thereby formed. The plurality of insulating material parts 510 have a pattern shape corresponding to the pattern of the photomask. As shown in FIG. 4A, each insulating material part 510 has a rectangular shape in plan view (as viewed in the thickness direction of the growth substrate 220), and has a plurality of holes 511 that pass through in the thickness direction of the growth substrate 220. The plurality of insulating material parts 510 are provided at positions separated from each other on the semiconductor layer 600, and are arrayed horizontally and vertically at a fixed interval in plan view. Note that, in the diagrams illustrating the manufacturing method from FIG. 4 onward, the plurality of holes 511 in each insulating material part 510 are represented in simplified form, and the size and number of holes 511 differ in practice.

Figure 5A:
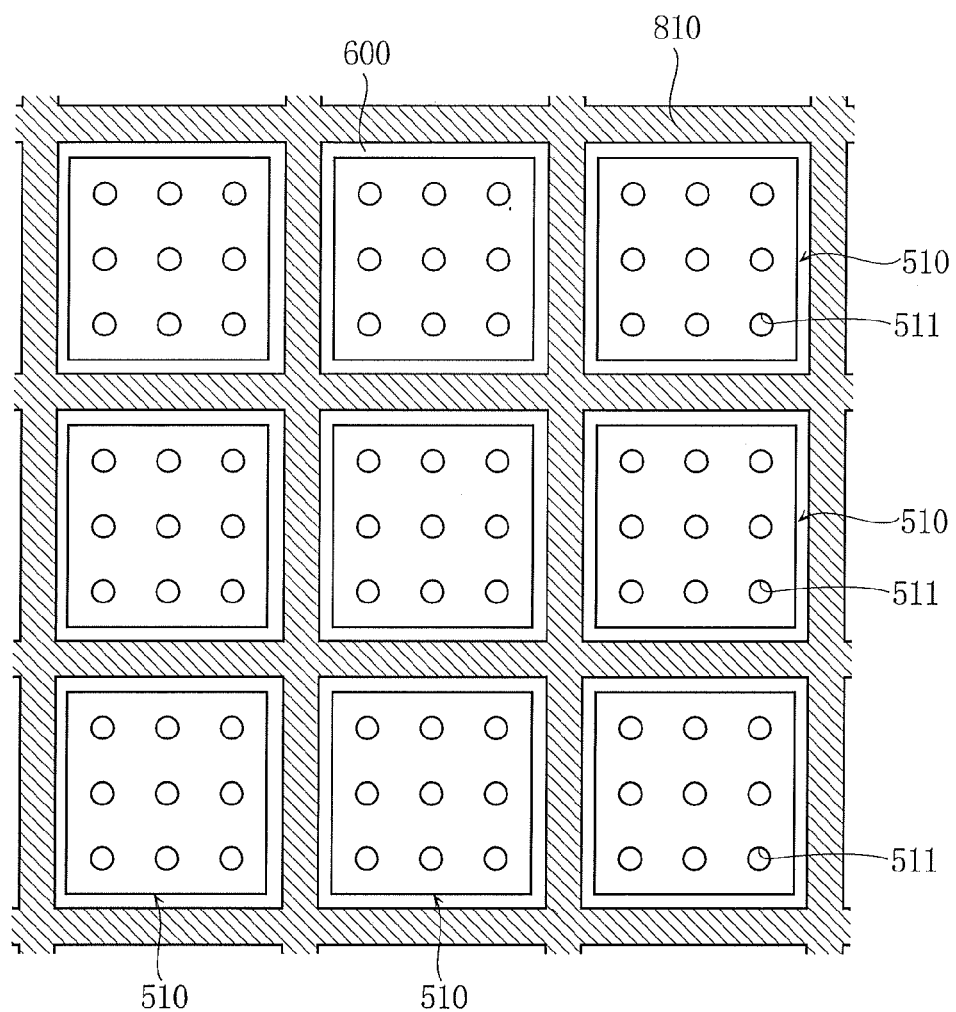
FIGS. 5A and 5B show one process of the method for manufacturing a semiconductor light-emitting element according to the first embodiment of the present invention, with FIG. 5A being a plan view of a main section and FIG. 5B being a cross-sectional view of a main section.
Figure 5B:
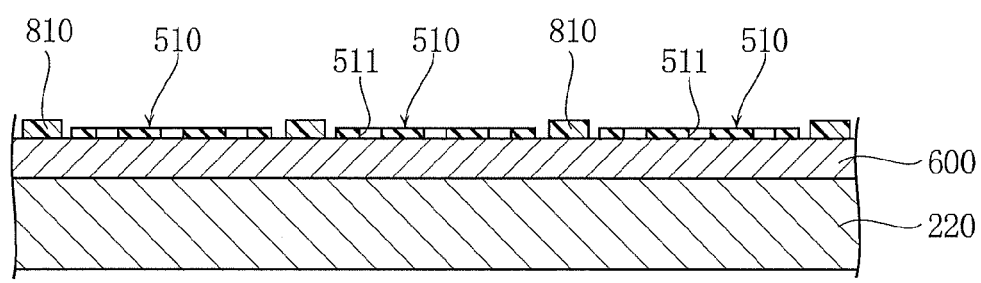

Next, as shown in FIG. 5, a resist layer 810 is formed on a portion on the semiconductor layer 600 where the plurality of insulating material parts 510 are not formed. The resist layer 810 is formed in a pattern that partitions adjacent insulating material parts 510. In FIG. 5A, the resist layer 810 is hatched in order to clearly show the region in which the resist layer 810 is formed. The width of the resist layer 810 is less than the interval between adjacent insulating material parts 510, and the resist layer 810 is at a distance from each of the insulating material parts 510.

Figure 6:
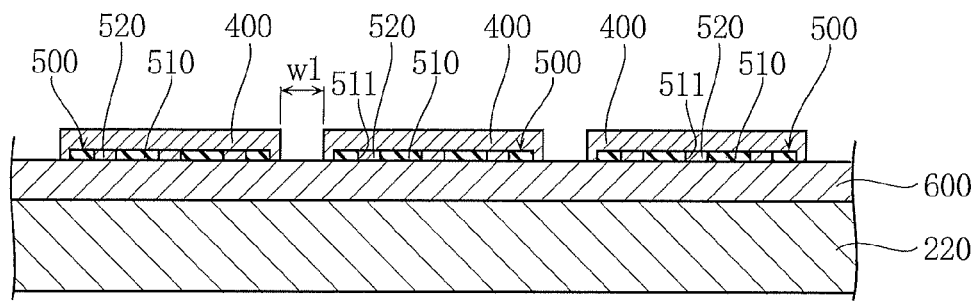
FIG. 6 is a cross-sectional view of a main section showing one process of the method for manufacturing a semiconductor light-emitting element according to the first embodiment of the present invention.

Next, the second metal layer 400 is formed as shown in FIG. 6. In forming the second metal layer 400, a metal material is laminated on the semiconductor layer 600 and on the plurality of the insulating material parts 510. The second metal layer 400 is formed by vapor-depositing Au or a metal containing Au, for example, on the semiconductor layer 600 and on the plurality of insulating material parts 510. Also, the second metal layer 400 may have a structure obtained by laminating a plurality of layers consisting of Au or an Au alloy. In the case where the second metal layer 400 has a laminated structure consisting of a plurality of layers, the second metal layers 400 are formed as a laminated structure consisting of AuBeNi/Au or AuBeNi/Au/Mo/Au. In the case of the laminated structure consisting of AuBeNi/Au, the AuBeNi layer has a thickness of about 2,000 Å, and the Au layer has a thickness of about 14,000 Å, for example. Also, in the case of the laminated structure consisting of AuBeNi/Au/Mo/Au, the AuBeNi layer has a thickness of about 2,000 Å, the Au layer has a thickness of about 4,000 Å, and the Mo layer has a thickness of about 2,000 Å, and the Au layer has a thickness of about 15,000 Å. At the time of forming the second metal layer 400, each hole 511 is filled with a metal material in each of the plurality of insulating material parts 510. Next, the resist layer 810 and portions of the second metal layer 400 that are formed on the resist layer 810 are removed using a technique such as liftoff, for example. The metal material parts 520 and the second metal layer 400 shown in FIG. 6 are thereby formed. In forming the resist layer 810 shown in FIG. 5, the resist layer 810 is provided at a distance from the insulating material parts 510 in order to form the extended part 420 (not shown in FIG. 5) of the second metal layer 400 between the resist layer 810 and the insulating material part 510. The translucent conductive layer 500 is constituted by the insulating material part 510 and the metal material parts 520. Here, the translucent conductive layer 500 is covered by the second metal layer 400. The second metal layer 400 is provided at a plurality of locations separated from each other, so as to respectively correspond to the plurality of translucent conductive layers 500. The semiconductor layer 600 is exposed between adjacent second metal layers 400. An interval w1 between the adjacent second metal layers 400 is greater than a width dimension d1 (see FIG. 12) of a dicing blade Db that will be discussed later.

Figure 7:
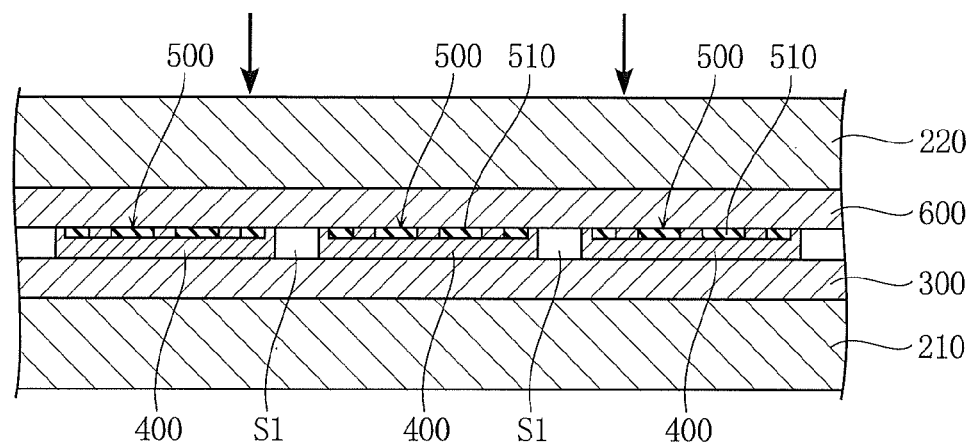
FIG. 7 is a cross-sectional view of a main section showing one process of the method for manufacturing a semiconductor light-emitting element according to the first embodiment of the present invention.

Next, as shown in FIG. 7, the first metal layer 300 formed on a support substrate 210 and the second metal layer 400 are stacked one on top of the other, and the first and second metal layers 300 and 400 are joined. The first metal layer 300 is formed by vapor depositing Au or a metal containing Au, for example, on the support substrate 210. The first and second metal layers 300 and 400 are joined by thermocompression bonding, for example. Thermocompression bonding is performed at a temperature of approximately 250° C. to 700° C. and preferably approximately 300° C. to 400° C., and at a pressure of approximately 10 MPa to 20 MPa. Here, since the second metal layers 400 are provided so as to be separated from each other, spaces S1 enclosed by adjacent second metal layers 400, the first metal layer 300, and the semiconductor layer 600 are formed.

Figure 8:
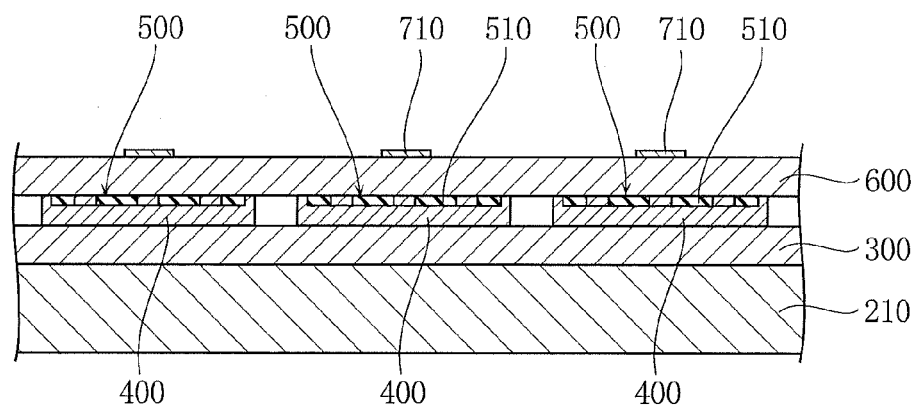
FIG. 8 is a cross-sectional view of a main section showing one process of the method for manufacturing a semiconductor light-emitting element according to the first embodiment of the present invention.

Next, the growth substrate 220 is removed by a wet etching technique, for example, exposing the semiconductor layer 600, and surface electrodes 710 having a predetermined shape are formed on the semiconductor layer 600, as shown in FIG. 8. The surface electrodes 710 are formed using a liftoff technique, for example.

Figure 9:
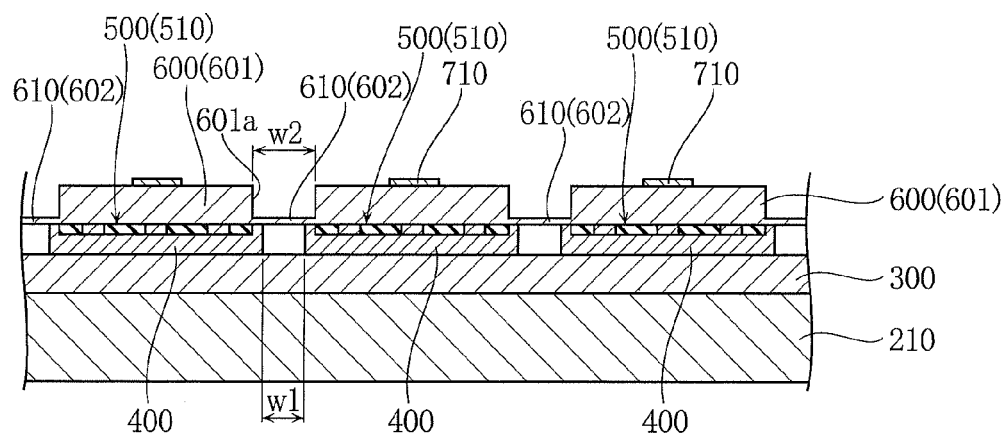
FIG. 9 is a cross-sectional view of a main section showing one process of the method for manufacturing a semiconductor light-emitting element according to the first embodiment of the present invention.
Figure 10:
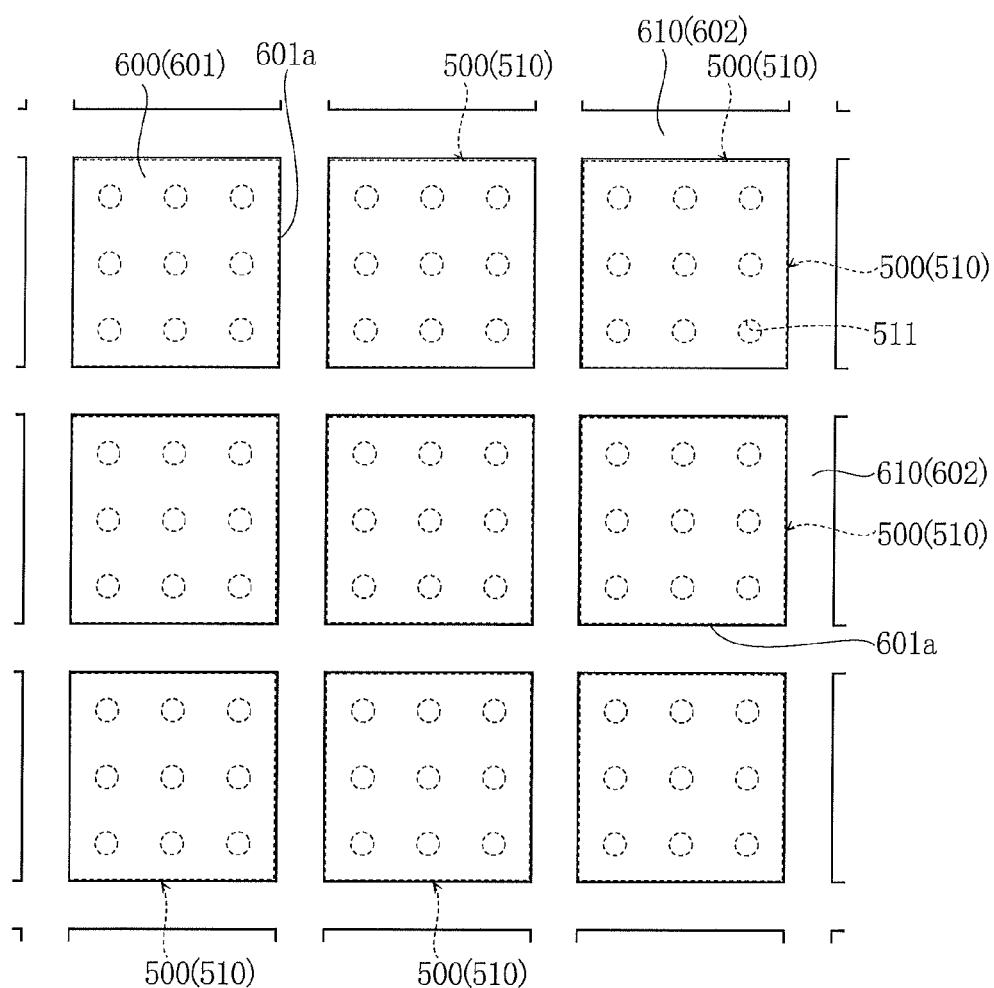
FIG. 10 is a plan view of a main section showing one process of the method for manufacturing a semiconductor light-emitting element according to the first embodiment of the present invention.

Next, a portion of the semiconductor layer 600 is removed, as shown in FIGS. 9 and 10. The semiconductor layer 600 is removed by a wet etching technique, for example. Portions of the semiconductor layers 600 that do not overlap with the translucent conductive layer 500 as viewed in the thickness direction of the support substrate 210 are removed. In the present embodiment, the n-type contact layer 660, the n-type window layer 650, the n-type cladding layer 640, the active layer 630, and the p-type cladding layer 620 (a detailed lamination state is not shown; first semiconductor layer part 601) of the semiconductor layer 600 are partially removed, but the p-type contact layer 610 (second semiconductor layer part 602) is not removed. The semiconductor layer 600 can be partially removed in this way using an etching solution that removes the first semiconductor layer part 601 but does not removed the second semiconductor layer part 602. Examples of such an etching solution include a mixture of hydrochloric acid and nitric acid, a mixture of hydrochloric acid and hydrogen peroxide solution, and a mixture of sulfuric acid and hydrogen peroxide solution. Generally, the GaP constituting the p-type contact layer 610 is not removed by the etching solution. This property results in only the p-type contact layer 610 remaining exposed in the form of a thin skin, without being removed by the etching solution. Note that by changing conditions such as the mix ratio and concentration of the etching solution, it is also possible to remove the p-type contact layer 610, in which case the p-type contact layer 610 does not remain in the form of a thin skin. Here, grid-like groove parts 601a aligned horizontally and vertically are formed in the portions where the semiconductor layer 600 (first semiconductor layer part 601) has been removed, as viewed in the thickness direction of the support substrate 210. These groove parts 601a are formed so as to partition adjacent insulating materials 510 (translucent conductive layers 500), as viewed in the thickness direction of the support substrate 210. A width dimension w2 of the groove parts 601a is greater than the interval w1 between adjacent second metal layers 400.

Figure 11:
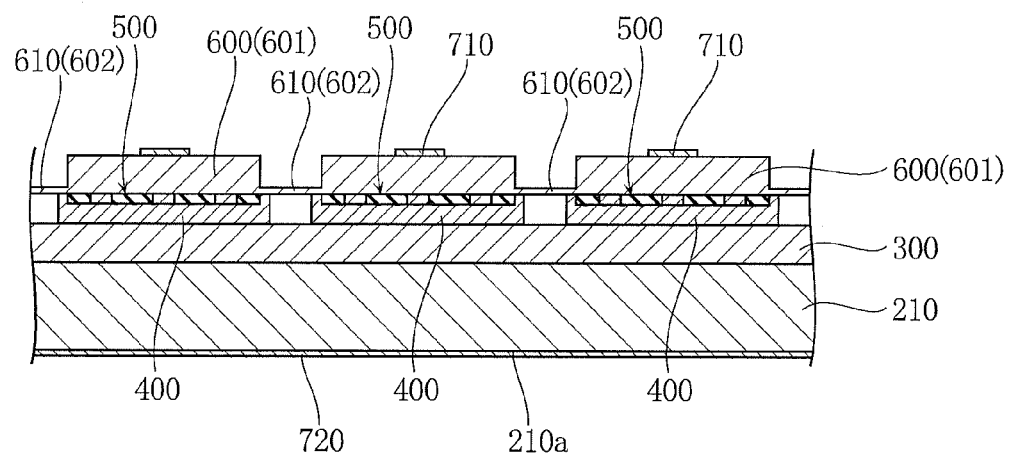
FIG. 11 is a cross-sectional view of a main section showing one process of the method for manufacturing a semiconductor light-emitting element according to the first embodiment of the present invention.

Next, as shown in FIG. 11, the back electrode 720 is formed on a back surface 210a (surface on the opposite side to the semiconductor layer side) of the support substrate 210. The back electrode 720 is formed by vapor depositing Au or a metal containing Au, for example, on the back surface 210a of the support substrate 210.

Figure 12:
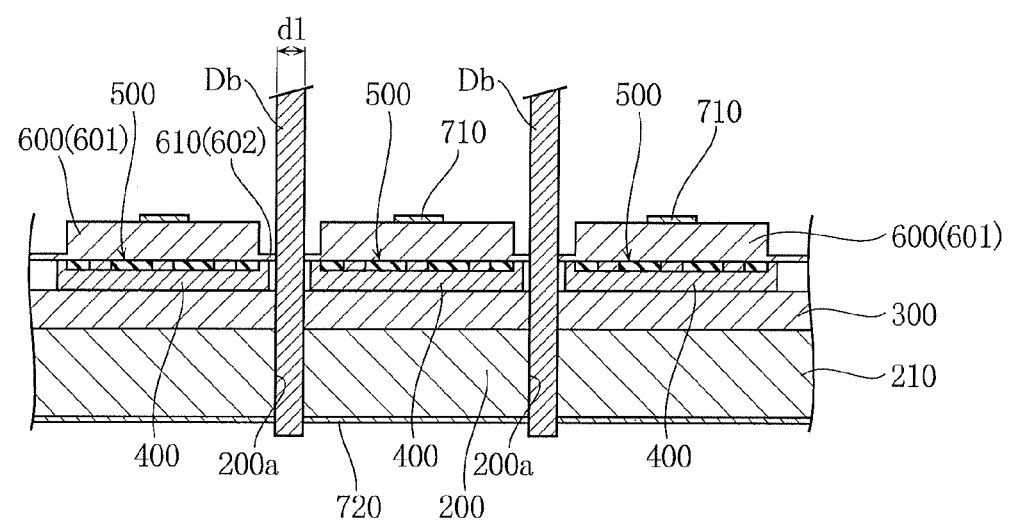
FIG. 12 is a cross-sectional view of a main section showing one process of the method for manufacturing a semiconductor light-emitting element according to the first embodiment of the present invention.

Next, as shown in FIG. 12, the first metal layer 300 and the support substrate 210 are cut. The first metal layer 300 and the support substrate 210 are cut using the dicing blade Db. Cutting is performed in the thickness direction of the support substrate 210, at positions that avoid the translucent conductive layers 500 and the second metal layers 400 covering the translucent conductive layers 500. When cutting is performed, the p-type contact layer 610 exposed in the form of a thin skin is also cut along with the first metal layer 300 and the support substrate 210. When the p-type contact layer 610 is cut, the thin skin-like remaining portion of the p-type contact layer 610 breaks along the end face of the semiconductor layer 600 (first semiconductor layer part 601) that is positioned thereabove. By thus cutting using the dicing blade Db, the support substrate 210 is divided into a plurality of chip-shaped substrates 200. A cut surface is formed across an entire area of the end face 200a of the substrate 200 in the thickness direction. The above enables a plurality of semiconductor light-emitting elements 101 to be manufactured.

Next, the operations and effects of the present embodiment will be described.

In the semiconductor light-emitting element 101 of the present embodiment, the end face 500a of the translucent conductive layer 500 is located more inwardly than the end face 200a of the substrate 200 as viewed in the thickness direction z. Such a configuration is realized with regard to the plurality of translucent conductive layers 500 separated from each other, by cutting at positions that avoid these translucent conductive layers 500, when cutting the support substrate 210 in the thickness direction thereof in manufacturing the semiconductor light-emitting elements 101. Accordingly, the translucent conductive layers 500 are not affected by curling up due to cutting the first metal layer 300 because they are not cut when forming chips by dicing. As a result, according to the present embodiment, exfoliation of the translucent conductive layers 500 when manufacturing the semiconductor light-emitting elements 101 can be appropriately prevented.

In manufacturing the semiconductor light-emitting elements 101, the second metal layer 400 is provided in a plurality of locations separated from each other, so as to respectively correspond to the plurality of translucent conductive layers 500. The spaces S1 enclosed by adjacent second metal layers 400, the first metal layer 300 and the semiconductor layer 600 are thus formed when joining the first and second metal layers 300 and 400. The spaces S1 can thereby function as air vents when joining the first and second metal layers 300 and 400, and the trapping of air bubbles between the first and second metal layers 300 and 400 can be avoided. This is suitable for preventing a drop in the adhesion force of the first and second metal layers 300 and 400.

In the semiconductor light-emitting element 101, the outer peripheral surface of the second metal layer 400 (outer peripheral surface 420a of the extended part 420) is located more inwardly than the end face 200a of the substrate 200 as viewed in the thickness direction z. Such a configuration is realized with regard to the second metal layer 400 provided in a plurality of locations separated from each other, by cutting at positions that avoid the second metal layers 400, when cutting the support substrate 210 in the thickness direction thereof in manufacturing the semiconductor light-emitting elements 101. The cut resistance of Au constituting the second metal layer 400 at the time of dicing is comparatively high. In the present embodiment, the second metal layer 400 is not cut, thus enabling the amount of Au that is cut to be reduced. Accordingly, the cut resistance at the time of forming chips by dicing can be reduced, and improvement in the manufacture efficiency of the semiconductor light-emitting elements 101 can be achieved.

Hereinafter, other embodiments of the present invention are shown. Note that, in the diagrams that are referred to in these embodiments, the same reference signs as the above embodiment are given to elements that are the same as or similar to the above embodiment, and description thereof will be omitted as appropriate.

Next, a second embodiment of the present invention will be described.

Figure 13:
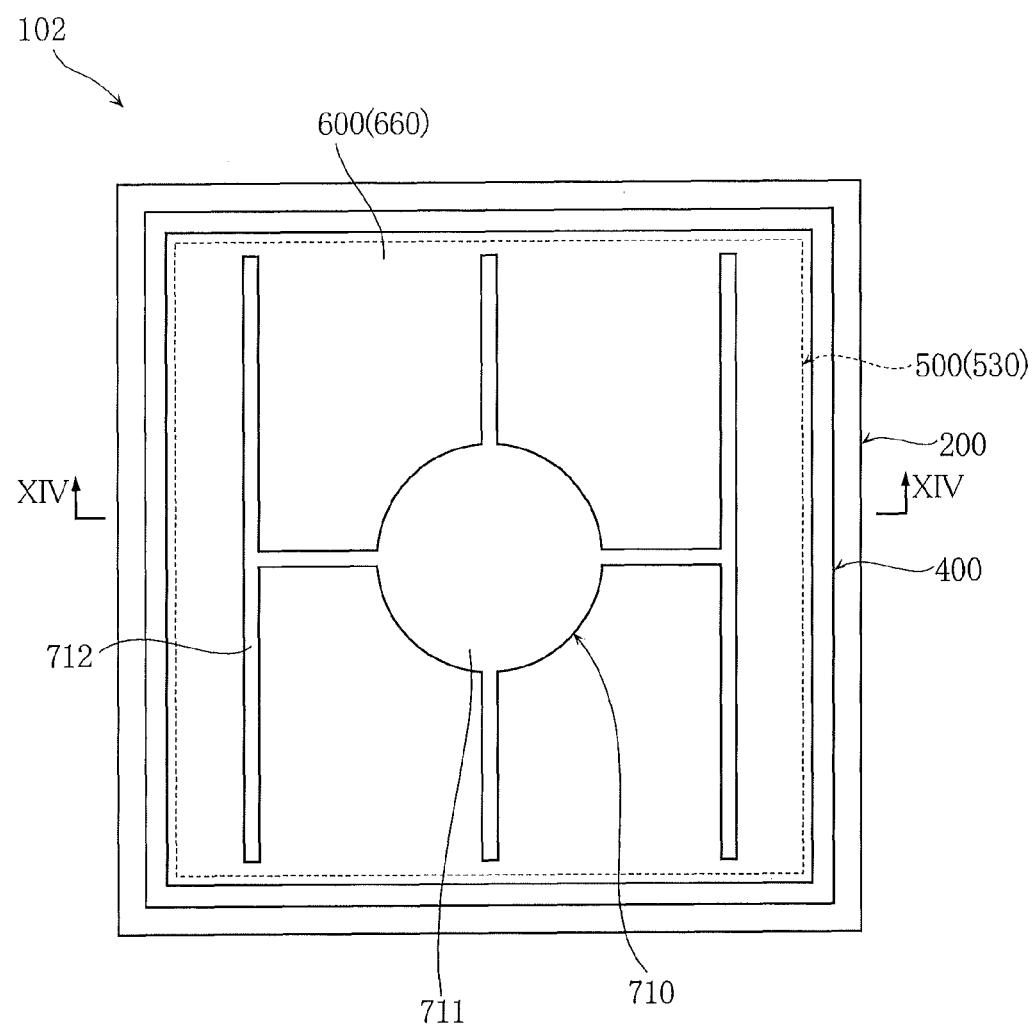
FIG. 13 is a plan view showing a semiconductor light-emitting element according to a second embodiment of the present invention.
Figure 14:
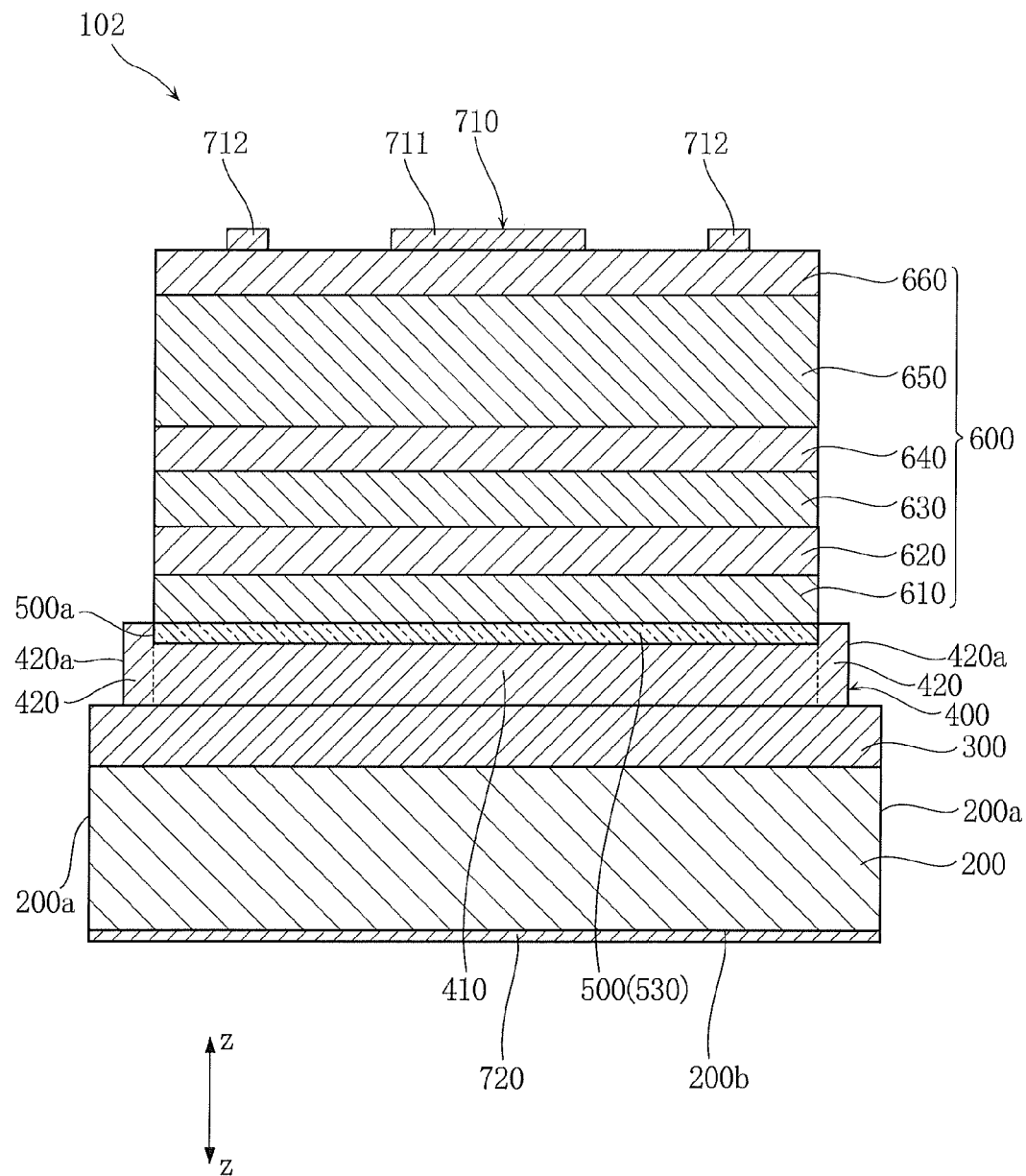
FIG. 14 is a cross-sectional view along a XIV-XIV line in FIG. 13.

FIGS. 13 and 14 show a semiconductor light-emitting element according to the second embodiment of the present invention. A semiconductor light-emitting element 102 of the present embodiment mainly differs from the semiconductor light-emitting element 101 of the above embodiment in terms of the configuration of the translucent conductive layer 500.

In the semiconductor light-emitting element 102, the translucent conductive layer 500 is constituted by a translucent conductive material having translucency and conductivity, and consists of a single translucent conductive material part 530. The material constituting the translucent conductive material part 530 (translucent conductive layer 500) is ITO (indium oxide tin), for example.

In the translucent conductive material part 530 (translucent conductive layer 500), an end face 500a (outer peripheral surface of the translucent conductive layer 500 as viewed in the thickness direction z) that intersects a plane which is orthogonal to the thickness direction z is rectangular in shape. The end face 500a is located more inwardly than the end face 200a of the substrate 200 as viewed in the thickness direction z. Also, the end face 500a is covered by an extended part 420 of a second metal layer 400.

The semiconductor light-emitting element 102 shown in FIG. 13 has a rectangular outer shape in plan view (as viewed in the thickness direction z), and is, for example, square with sides of about 200 μm.

Next, an exemplary method for manufacturing the semiconductor light-emitting element 102 will be described with reference to FIGS. 15A to 23.

Figure 15A:
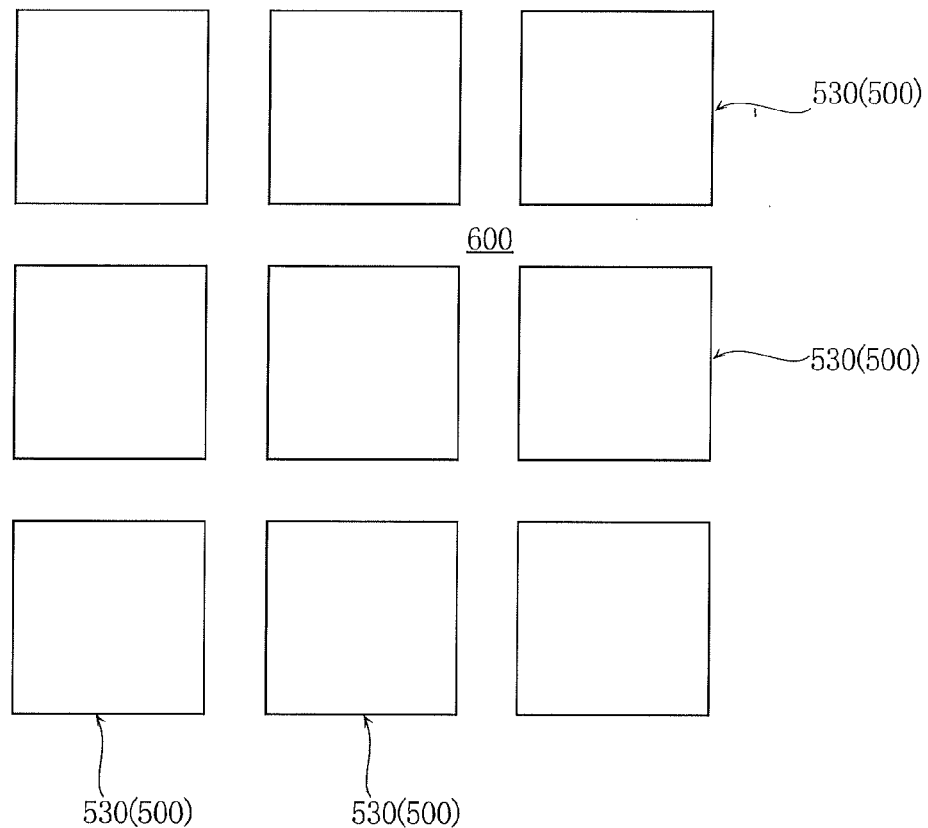
FIGS. 15A and 15B show one process of a method for manufacturing a semiconductor light-emitting element according to the second embodiment of the present invention, with FIG. 15A being a plan view of a main section and FIG. 15B being a cross-sectional view of a main section.
Figure 15B:
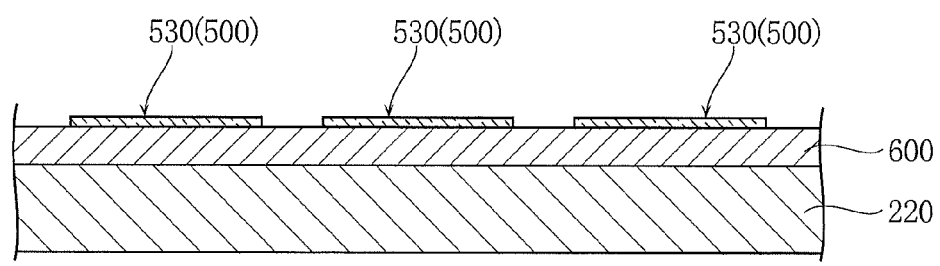

As shown in FIGS. 15A and 15B, a plurality of translucent conductive material parts 530 are formed on a semiconductor layer 600 laminated on a growth substrate 220. In forming the translucent conductive material part 530, first a translucent conductive material (e.g., ITO) having translucency and conductivity is formed as a film on the semiconductor layer 600 by a vacuum evaporation method or a sputtering method, and a translucent conductive film (not shown) is formed. Next, using a photolithographic method, a photoresist is applied onto the translucent conductive film, and exposure using a photomask having predetermined pattern shape, etching, and resist removal are sequentially performed. A plurality of translucent conductive material parts 530 (translucent conductive layers 500) are thereby formed. The plurality of translucent conductive material parts 530 have a pattern shape corresponding to the pattern of the photomask. As shown in FIG. 15A, each translucent conductive material part 530 has a rectangular shape in plan view (as viewed in the thickness direction of the growth substrate 220). The plurality of translucent conductive material parts 530 are provided at positions separated from each other on the semiconductor layer 600, and are arrayed horizontally and vertically at a fixed interval in plan view.

Figure 16A:
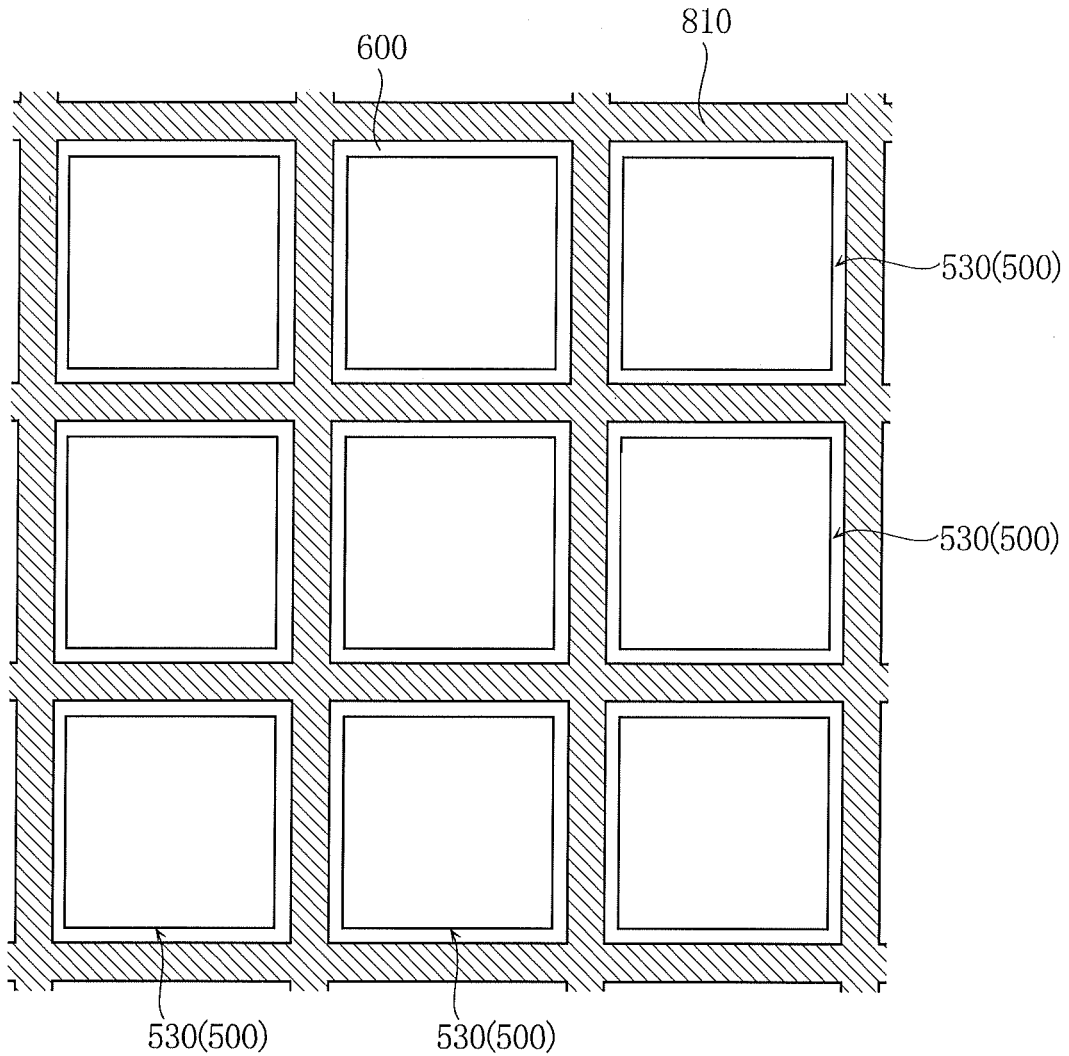
FIGS. 16A and 16B show one process of the method for manufacturing a semiconductor light-emitting element according to the second embodiment of the present invention, with FIG. 16A being a plan view of a main section and FIG. 16B being a cross-sectional view of a main section.
Figure 16B:
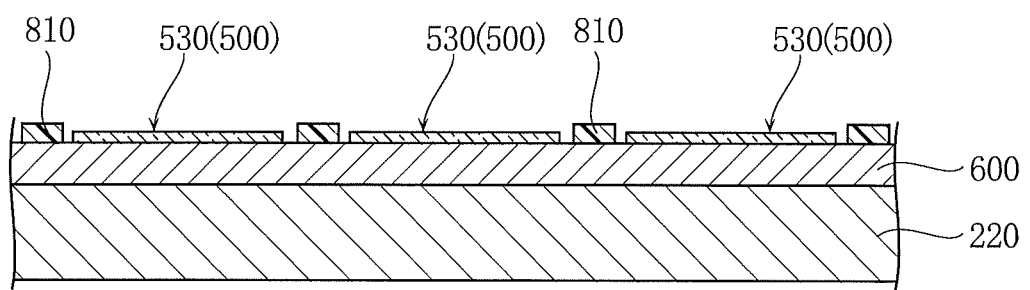

Next, as shown in FIG. 16, a resist layer 810 is formed on a portion on the semiconductor layer 600 where the plurality of translucent conductive material parts 530 are not formed. The resist layer 810 is formed in a pattern that partitions adjacent translucent conductive material parts 530. In FIG. 16A, the resist layer 810 is hatched in order to clearly show the region in which the resist layer 810 is formed. The width of the resist layer 810 is less than the interval between adjacent translucent conductive material parts 530, and the resist layer 810 is at a distance from each of the translucent conductive material parts 530.

Figure 17:
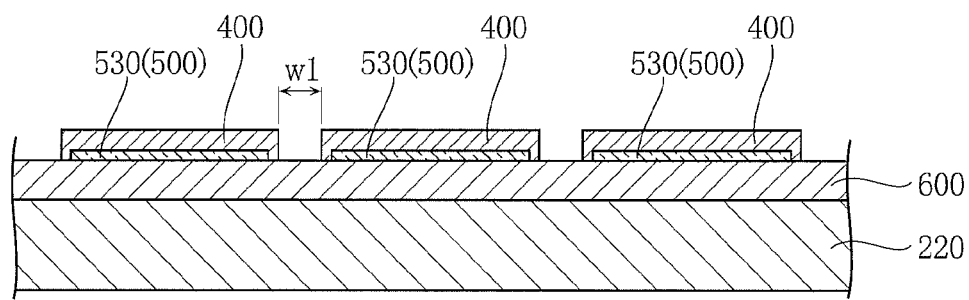
FIG. 17 is a cross-sectional view of a main section showing one process of the method for manufacturing a semiconductor light-emitting element according to the second embodiment of the present invention.

Next, the second metal layer 400 is formed as shown in FIG. 17. In forming the second metal layer 400, a metal material is laminated on the semiconductor layer 600 and the plurality of translucent conductive material parts 530. The second metal layer 400 is formed by vapor depositing Au or a metal containing Au, for example, on the semiconductor layer 600 and on the plurality of translucent conductive material parts 530. Next, the resist layer 810 and portions of the second metal layer 400 that are formed on the resist layer 810 are removed using a technique such as liftoff, for example. The second metal layer 400 shown in FIG. 17 is thereby formed. Here, the translucent conductive material part 530 (translucent conductive layer 500) is covered by the second metal layer 400. In forming the resist layer 810 shown in FIG. 16, the resist layer 810 is provided at a distance from the translucent conductive material part 530 of the resist layer 810 in order to form the extended part 420 (not shown in FIG. 16) of the second metal layer 400 between the resist layer 810 and the translucent conductive material part 530. The second metal layer 400 is provided at a plurality of locations separated from each other, so as to respectively correspond to the plurality of translucent conductive material parts 530 (translucent conductive layers 500). The semiconductor layer 600 is exposed between adjacent second metal layers 400. An interval w1 between the adjacent second metal layers 400 is greater than a width dimension d1 (see FIG. 12) of a dicing blade Db that will be discussed later.

Figure 18:
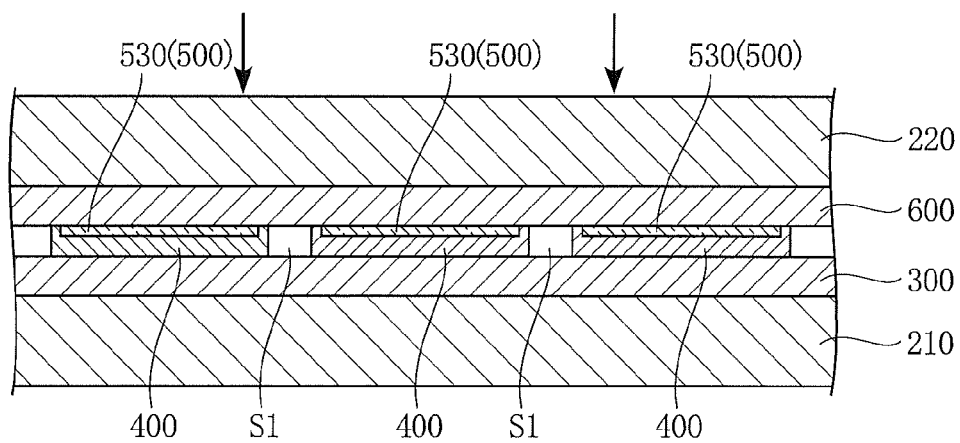
FIG. 18 is a cross-sectional view of a main section showing one process of the method for manufacturing a semiconductor light-emitting element according to the second embodiment of the present invention.

Next, as shown in FIG. 18, the first metal layer 300 formed on the support substrate 210 and the second metal layer 400 are stacked one on top of the other, and the first and second metal layers 300 and 400 are joined. The first metal layer 300 is formed by vapor depositing Au or a metal containing Au, for example, on a support substrate 210. The first and second metal layers 300 and 400 are joined by thermocompression bonding, for example. Here, since the second metal layers 400 are provided to be separated from each other, spaces S1 enclosed by adjacent second metal layers 400, the first metal layer 300, and the semiconductor layer 600 are formed.

Figure 19:
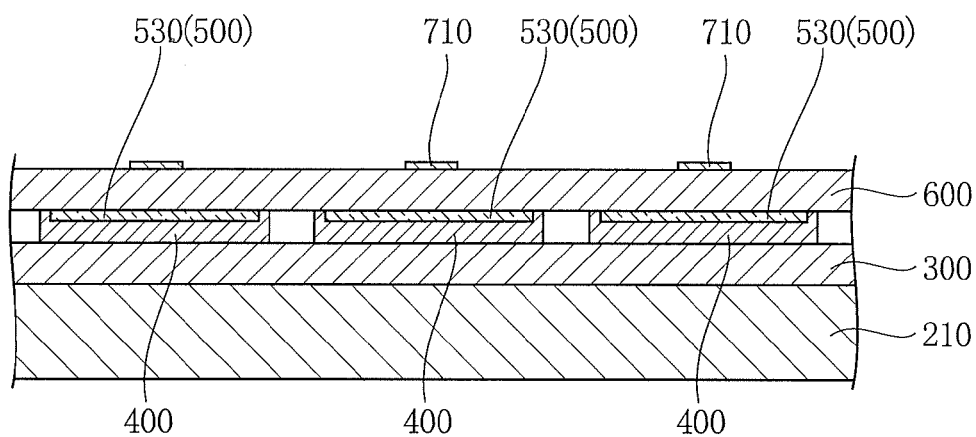
FIG. 19 is a cross-sectional view of a main section showing one process of the method for manufacturing a semiconductor light-emitting element according to the second embodiment of the present invention.

Next, the growth substrate 220 is removed by a wet etching technique, for example, exposing the semiconductor layer 600, and surface electrodes 710 having a predetermined shape are formed on the semiconductor layer 600, as shown in FIG. 19. The surface electrodes 710 are formed using a liftoff technique, for example.

Figure 20:
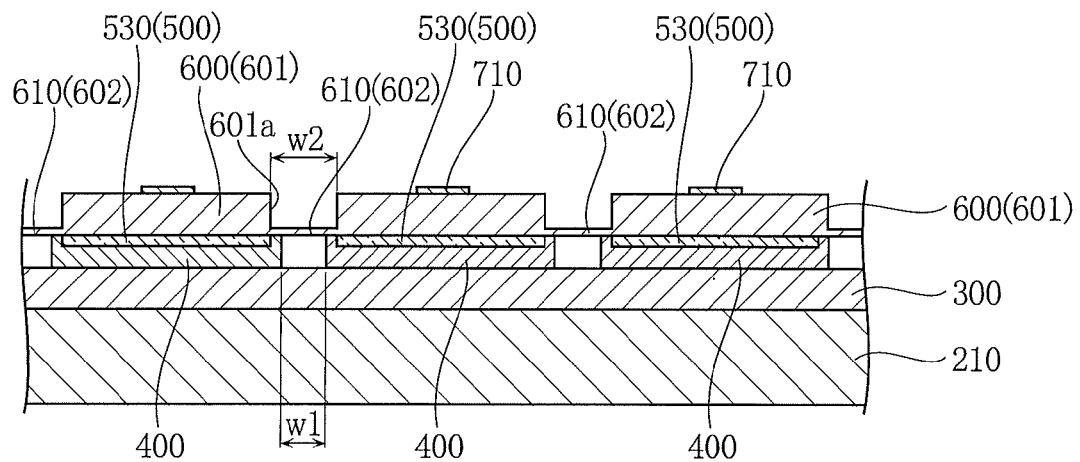
FIG. 20 is a cross-sectional view of a main section showing one process of the method for manufacturing a semiconductor light-emitting element according to the second embodiment of the present invention.
Figure 21:
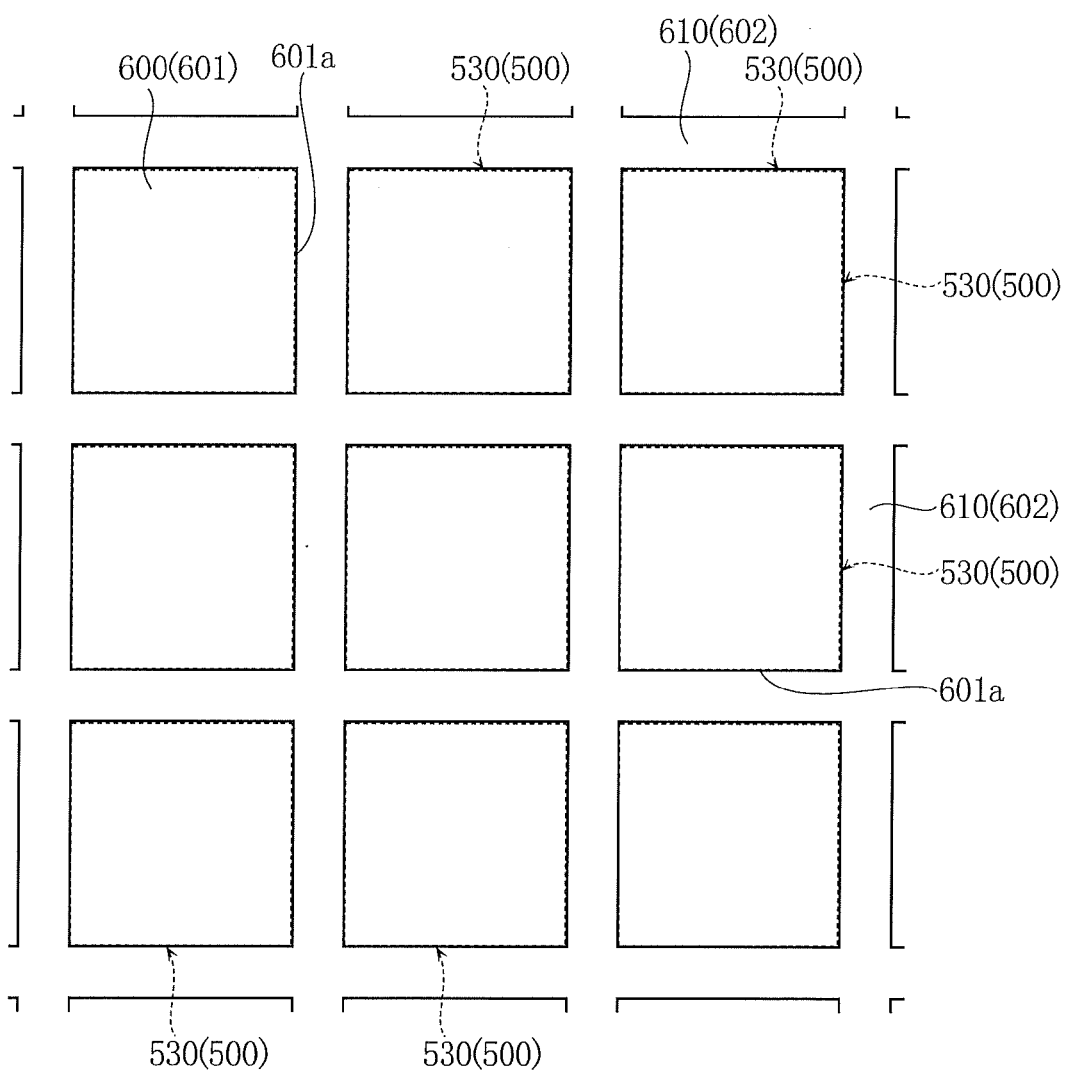
FIG. 21 is a plan view of a main section showing one process of the method for manufacturing a semiconductor light-emitting element according to the second embodiment of the present invention.

Next, a portion of the semiconductor layer 600 is removed, as shown in FIGS. 20 and 21. The semiconductor layer 600 is removed by a wet etching technique, for example. Portions of the semiconductor layers 600 that do not overlap with the translucent conductive layer 500 as viewed in the thickness direction of the support substrate 210 are removed. In the present embodiment, the n-type contact layer 660, the n-type window layer 650, the n-type cladding layer 640, the active layer 630, and the p-type cladding layer 620 (a detailed lamination state is not shown; first semiconductor layer part 601) of the semiconductor layer 600 are partially removed, but the p-type contact layer 610 (second semiconductor layer part 602) is not removed. The semiconductor layer 600 can be partially removed in this way using an etching solution that removes the first semiconductor layer part 601 but does not removed the second semiconductor layer part 602. Thereby, only the p-type contact layer 610 remains exposed in the form of a thin skin, without being removed by the etching solution. Note that the p-type contact layer 610 does not remain in the form of a thin skin if an etching solution for removing the p-type contact layer 610 is used. Here, grid-like groove parts 601a aligned horizontally and vertically are formed in the portions where the semiconductor layer 600 (first semiconductor layer part 601) has been removed, as viewed in the thickness direction of the support substrate 210. These groove parts 601a are formed so as to partition adjacent translucent conductive material parts 530 (translucent conductive layers 500), as viewed in the thickness direction of the support substrate 210. A width dimension w2 of the groove parts 601a is greater than the interval w1 between adjacent second metal layers 400.

Figure 22:
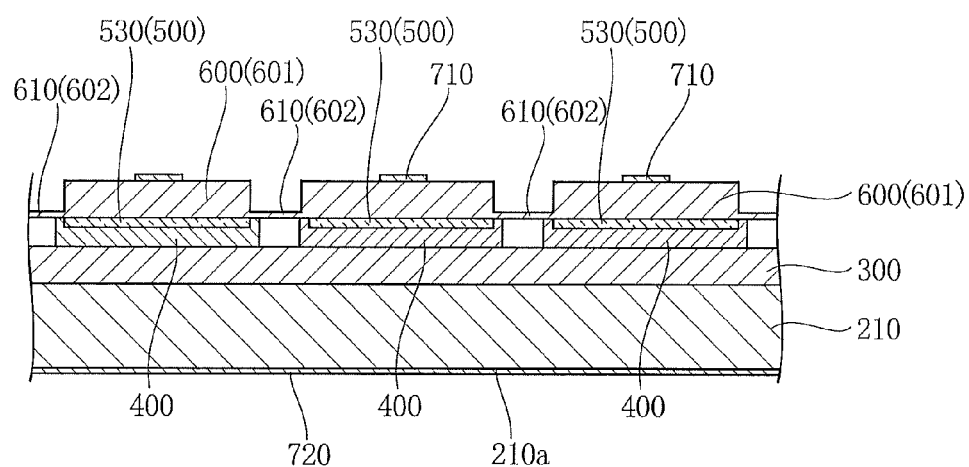
FIG. 22 is a cross-sectional view of a main section showing one process of the method for manufacturing a semiconductor light-emitting element according to the second embodiment of the present invention.

Next, as shown in FIG. 22, the back electrode 720 is formed on a back surface 210a (surface on the opposite side to the semiconductor layer side) of the support substrate 210. The back electrode 720 is formed by vapor depositing Au or a metal containing Au, for example, on the back surface 210a of the support substrate 210.

Figure 23:
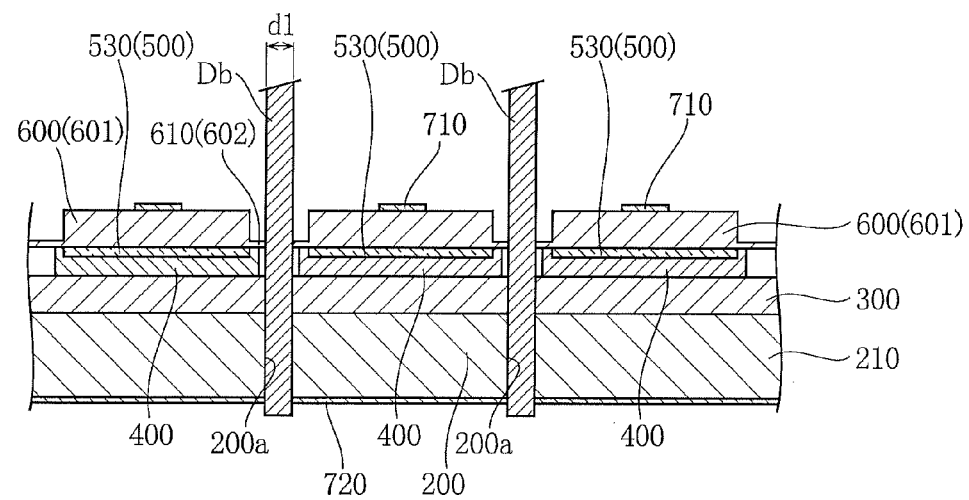
FIG. 23 is a cross-sectional view of a main section showing one process of the method for manufacturing a semiconductor light-emitting element according to the second embodiment of the present invention.

Next, as shown in FIG. 23, the first metal layer 300 and the support substrate 210 are cut. The first metal layer 300 and the support substrate 210 are cut using the dicing blade Db. Cutting is performed in the thickness direction of the support substrate 210, at positions that avoid the translucent conductive material parts 530 (translucent conductive layers 500) and the second metal layers 400 covering the translucent conductive layers 500. When cutting is performed, the p-type contact layer 610 exposed in the form of a thin skin is also cut along with the first metal layer 300 and the support substrate 210. When the p-type contact layer 610 is cut, the thin skin-like remaining portion of the p-type contact layer 610 breaks along the end face of the semiconductor layer 600 (first semiconductor layer part 601) that is positioned thereabove. By thus cutting using the dicing blade Db, the support substrate 210 is divided into a plurality of chip-shaped substrates 200. A cut surface is formed across an entire area of the end face 200a of the substrate 200 in the thickness direction. The above enables a plurality of semiconductor light-emitting elements 102 to be manufactured.

Next, the operations and effects of the present embodiment will be described.

In the semiconductor light-emitting element 102 of the present embodiment, the end face 500a of the translucent conductive layer 500 is located more inwardly than the end face 200a of the substrate 200 as viewed in the thickness direction z. Such a configuration is realized with regard to the plurality of translucent conductive layers 500 separated from each other, by cutting at positions that avoid these translucent conductive layers 500, when cutting the support substrate 210 in the thickness direction thereof in manufacturing the semiconductor light-emitting elements 102. Accordingly, the translucent conductive layers 500 are not affected by curling up due to cutting the first metal layer 300 because they are not cut when forming chips by dicing. As a result, according to the present embodiment, exfoliation of the translucent conductive layers 500 when manufacturing the semiconductor light-emitting elements 102 can be appropriately prevented.

In manufacturing the semiconductor light-emitting elements 102, the second metal layer 400 is provided in a plurality of locations separated from each other, so as to respectively correspond to the plurality of translucent conductive layers 500. The spaces S1 enclosed by adjacent second metal layers 400, the first metal layer 300 and the semiconductor layer 600 are thus formed when joining the first and second metal layers 300 and 400. The spaces S1 can thereby function as air vents when joining the first and second metal layers 300 and 400, and the trapping of air bubbles between the first and second metal layers 300 and 400 can be avoided. This is suitable for preventing a drop in the adhesion force of the first and second metal layers 300 and 400.

In the semiconductor light-emitting element 102, the outer peripheral surface of the second metal layer 400 (outer peripheral surface 420a of the extended part 420) is located more inwardly than the end face 200a of the substrate 200 as viewed in the thickness direction z. Such a configuration is realized with regard to the second metal layer 400 provided in a plurality of locations separated from each other, by cutting at positions that avoid the second metal layers 400, when cutting the support substrate 210 in the thickness direction thereof in manufacturing the semiconductor light-emitting elements 102. The cut resistance of Au constituting the second metal layer 400 at the time of dicing is comparatively high. In the present embodiment, the second metal layer 400 is not cut, thus enabling the amount of Au that is cut to be reduced. Accordingly, the cut resistance at the time of forming chips by dicing can be reduced, and improvement in the manufacture efficiency of the semiconductor light-emitting elements 102 can be achieved.

Next, a third embodiment of the present invention will be described.

Figure 24:
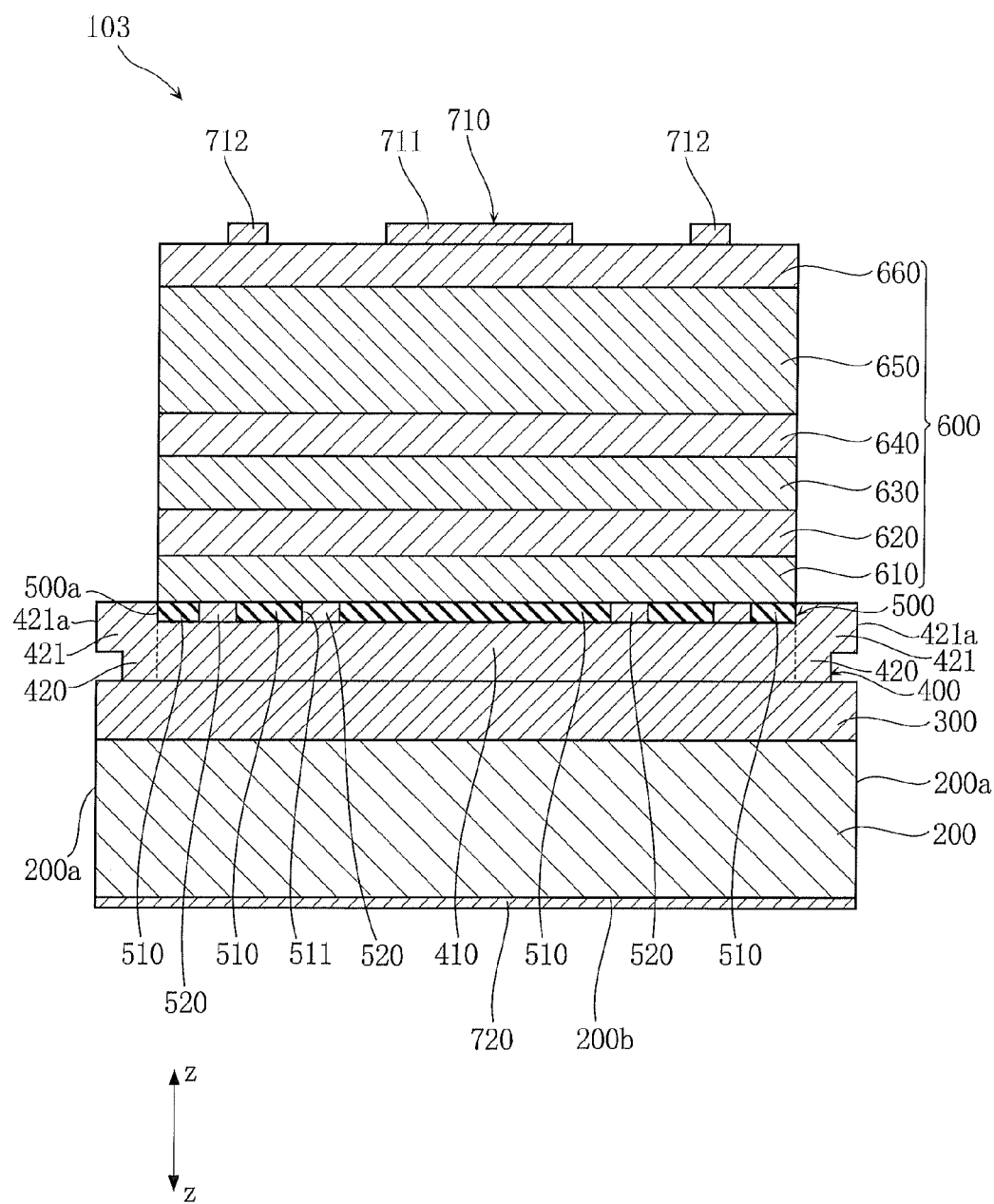
FIG. 24 is a cross-sectional view showing a semiconductor light-emitting element according to a third embodiment of the present invention.

FIG. 24 shows a semiconductor light-emitting element according to the third embodiment of the present invention. A semiconductor light-emitting element 103 of the present embodiment mainly differs from the semiconductor light-emitting element 101 of the above embodiment in terms of the configuration of the extended part 420 of the second metal layer 400.

In the semiconductor light-emitting element 103, the extended part 420 of the second metal layer 400 has a flange part 421 that protrudes outwardly as viewed in the thickness direction z of the substrate 200. The flange part 421 is located on the semiconductor layer 600 side across a gap from the first metal layer 300. In the flange part 421, an end face 421a that intersects a plane which is orthogonal to the thickness direction z is flush with an end face 200a of the substrate 200 as viewed in the thickness direction z.

Next, an exemplary method for manufacturing the semiconductor light-emitting element 103 will be described with reference to FIGS. 25A to 32.

Figure 25A:
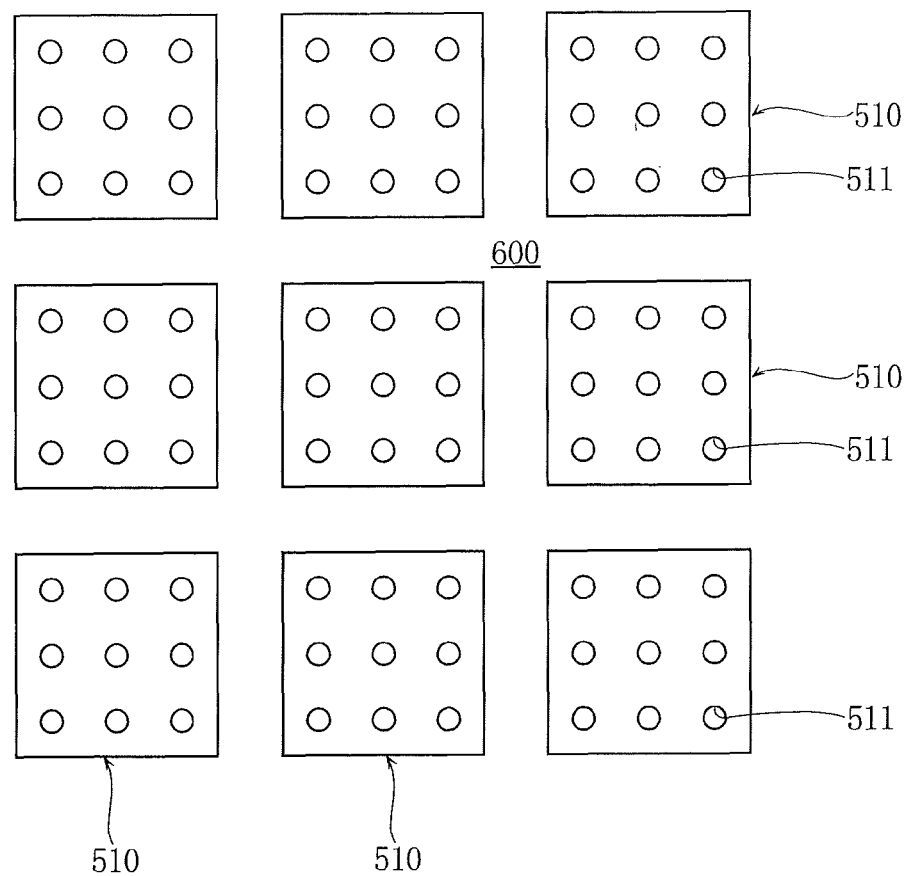
FIGS. 25A and 25B show one process of a method for manufacturing a semiconductor light-emitting element according to the third embodiment of the present invention, with FIG. 25A being a plan view of a main section and FIG. 25B being a cross-sectional view of a main section.
Figure 25B:
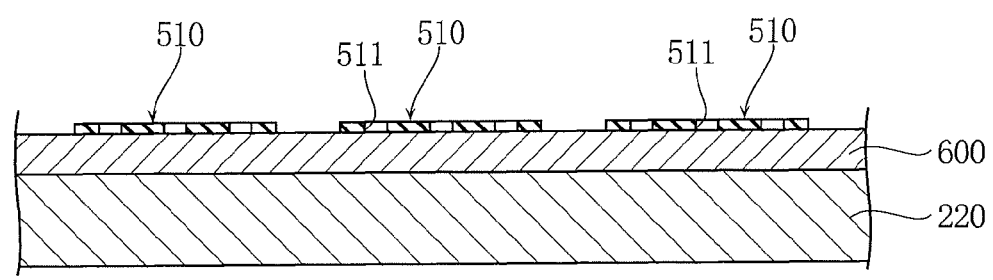

As shown in FIGS. 25A and 25B, a plurality of insulating material parts 510 are formed on a semiconductor layer 600 laminated on a growth substrate 220. In forming the insulating material part 510, first an insulating material (e.g., $SiO_2$) having translucency and insulation properties is formed as a film on the semiconductor layer 600 by a CVD method or a sputtering method, and an insulating film (not shown) is formed. Next, using a photolithographic method, a photoresist is applied onto the insulating film, and exposure using a photomask having predetermined pattern shape, etching, and resist removal are sequentially performed. A plurality of insulating material parts 510 are thereby formed. The plurality of insulating material parts 510 have a pattern shape corresponding to the pattern of the photomask. As shown in FIG. 25A, each insulating material part 510 has a plurality of holes 511 that pass through in the thickness direction of a growth substrate 220. The plurality of insulating material parts 510 are provided at positions separated from each other on the semiconductor layer 600, and are arrayed horizontally and vertically at a fixed interval in plan view.

Figure 26:
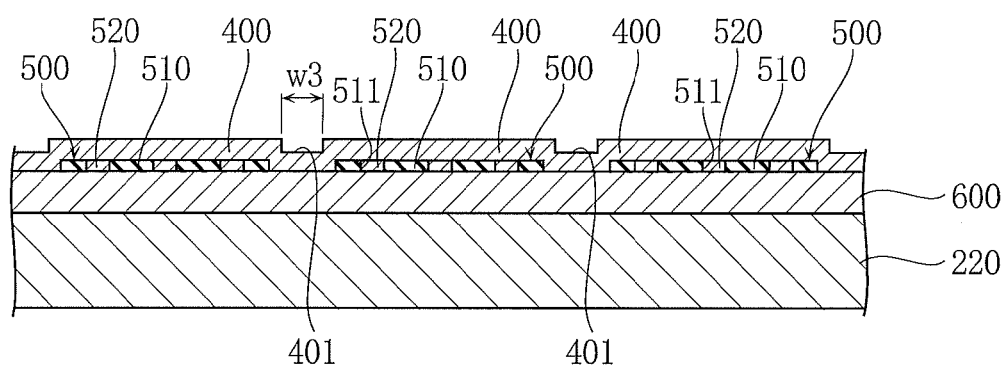
FIG. 26 is a cross-sectional view of a main section showing one process of the method for manufacturing a semiconductor light-emitting element according to the third embodiment of the present invention.

Next, the second metal layer 400 is formed as shown in FIG. 26. In forming the second metal layer 400, a metal material is laminated so as to entirely cover the semiconductor layer 600 and on the plurality of the insulating material parts 510. The second metal layer 400 is formed by vapor depositing Au or a metal containing Au, for example, on the semiconductor layer 600 and on the plurality of insulating material parts 510. At the time of forming the second metal layer 400, each hole 511 is filled with a metal material in each of the plurality of insulating material parts 510. Also, in forming the second metal layer 400 by vapor deposition, the second metal layer 400 will have a substantially constant thickness. Recessed parts 401 are thus formed in portions of the second metal layer that correspond to the intervals between adjacent insulating material parts 510. A width dimension w3 of the recessed parts 401 is greater than the width dimension d1 (see FIG. 32) of a dicing blade Db that will be discussed later.

The metal material parts 520 and the second metal layer 400 shown in FIG. 26 are thus formed. The translucent conductive layer 500 is constituted by the insulating material part 510 and the metal material parts 520. The translucent conductive layer 500 and the semiconductor layer 600 are covered by the second metal layer 400.

Figure 27:
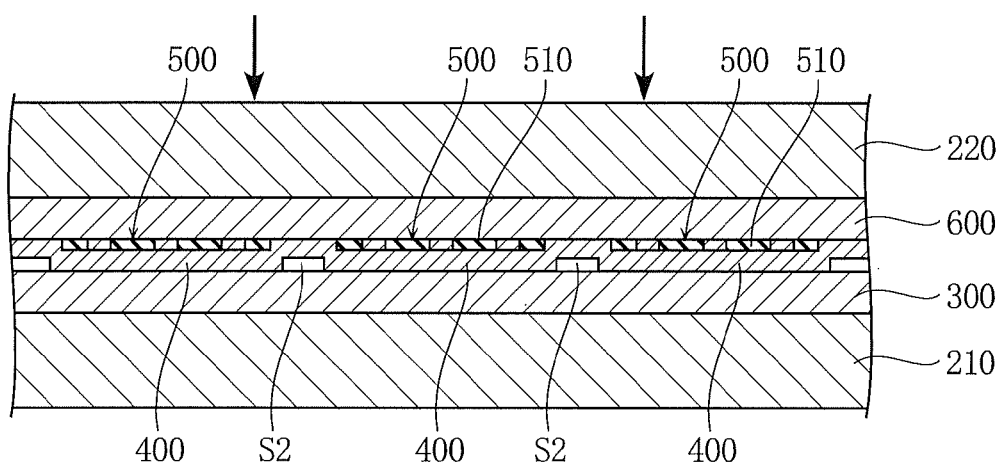
FIG. 27 is a cross-sectional view of a main section showing one process of the method for manufacturing a semiconductor light-emitting element according to the third embodiment of the present invention.

Next, as shown in FIG. 27, the first metal layer 300 formed on the support substrate 210 and the second metal layer 400 are stacked one on top of the other, and the first and second metal layers 300 and 400 are joined. The first metal layer 300 is formed by vapor depositing Au or a metal containing Au, for example, on a support substrate 210. The first and second metal layers 300 and 400 are joined by thermocompression bonding, for example. Here, since the recessed parts 401 are formed in the second metal layer 400, spaces S2 enclosed by the first metal layer 300 and the second metal layer 400 is formed in the portions where the recessed parts 401 are formed.

Figure 28:
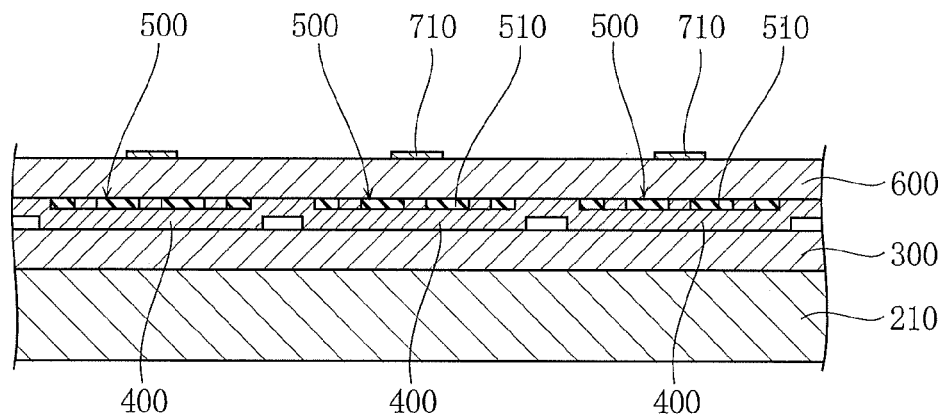
FIG. 28 is a cross-sectional view of a main section showing one process of the method for manufacturing a semiconductor light-emitting element according to the third embodiment of the present invention.

Next, the growth substrate 220 is removed by a wet etching technique, for example, exposing the semiconductor layer 600, and surface electrodes 710 having a predetermined shape are formed on the semiconductor layer 600, as shown in FIG. 28. The surface electrodes 710 are formed using a liftoff technique, for example.

Figure 29:
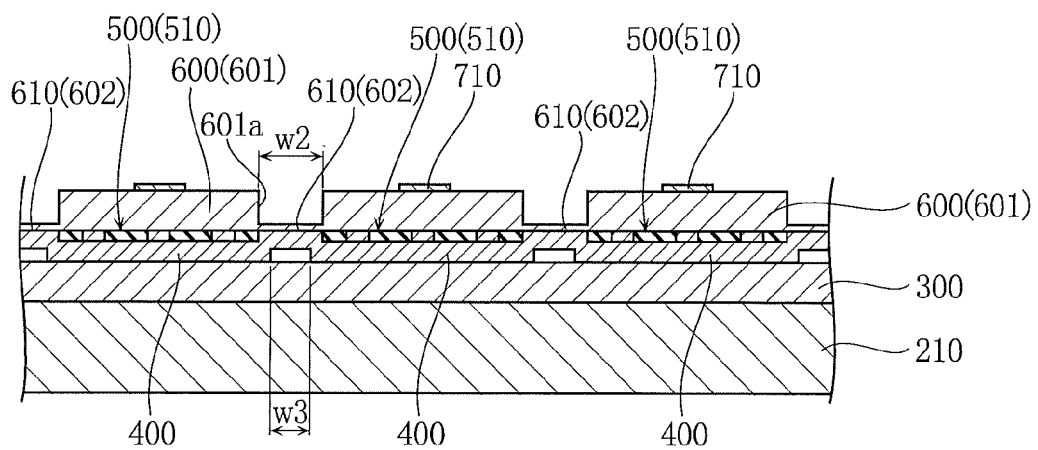
FIG. 29 is a cross-sectional view of a main section showing one process of the method for manufacturing a semiconductor light-emitting element according to the third embodiment of the present invention.
Figure 30:
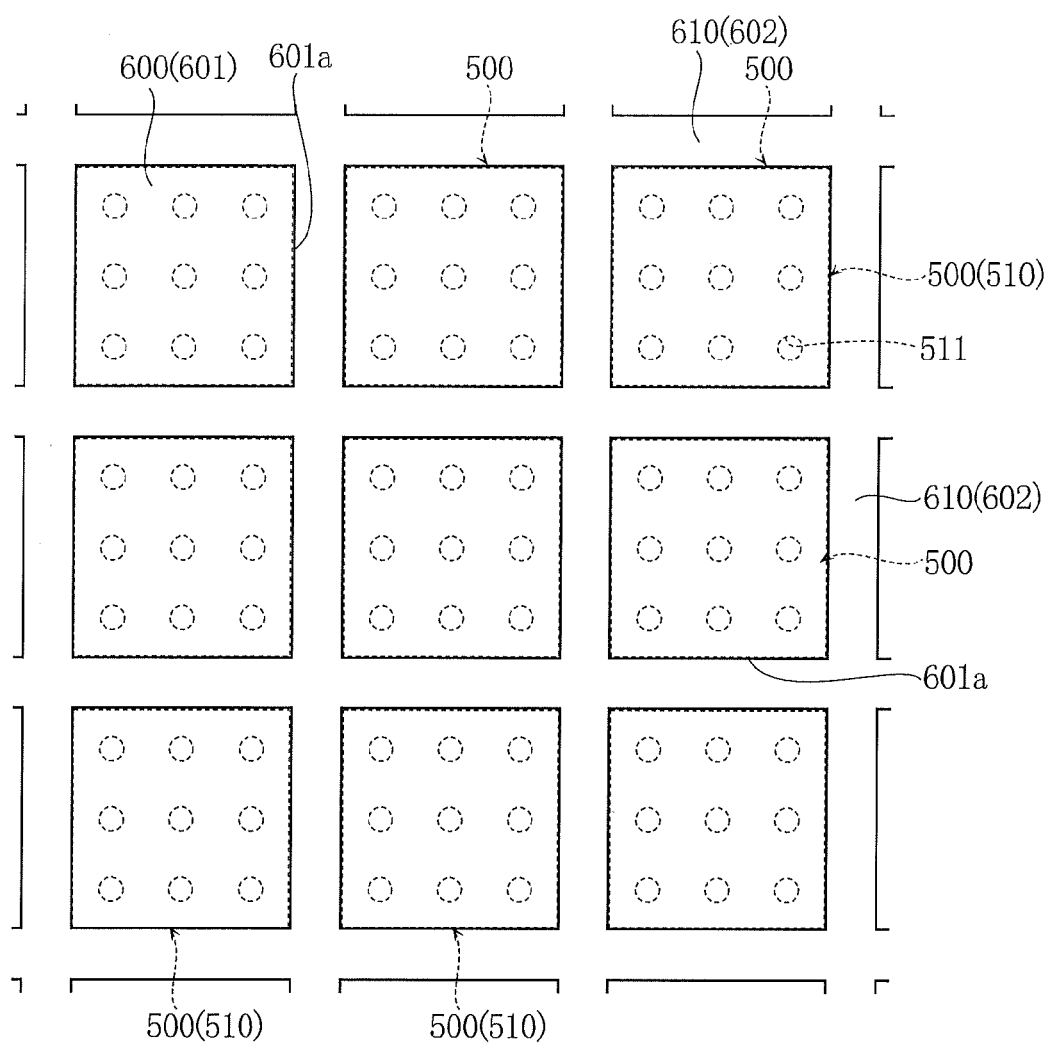
FIG. 30 is a plan view of a main section showing one process of the method for manufacturing a semiconductor light-emitting element according to the third embodiment of the present invention.

Next, a portion of the semiconductor layer 600 is removed, as shown in FIGS. 29 and 30. The semiconductor layer 600 is removed by a wet etching technique, for example. Portions of the semiconductor layers 600 that do not overlap with the translucent conductive layer 500 as viewed in the thickness direction of the support substrate 210 are removed. In the present embodiment, the n-type contact layer 660, the n-type window layer 650, the n-type cladding layer 640, the active layer 630, and the p-type cladding layer 620 (a detailed lamination state is not shown; first semiconductor layer part 601) of the semiconductor layer 600 are partially removed, but the p-type contact layer 610 (second semiconductor layer part 602) is not removed. The semiconductor layer 600 can be partially removed in this way using an etching solution that removes the first semiconductor layer part 601 but does not removed the second semiconductor layer part 602. Thereby, only the p-type contact layer 610 remains exposed in the form of a thin skin, without being removed by the etching solution. Note that the p-type contact layer 610 does not remain in the form of a thin skin if an etching solution for removing the p-type contact layer 610 is used. Here, grid-like groove parts 601a aligned horizontally and vertically are formed in the portions where the semiconductor layer 600 (first semiconductor layer part 601) has been removed, as viewed in the thickness direction of the support substrate 210. These groove parts 601a are formed so as to partition adjacent insulating materials 510 (translucent conductive layers 500), as viewed in the thickness direction of the support substrate 210. A width dimension w2 of the groove parts 601a is greater than the width dimension w3 of the recessed parts 401 of the second metal layer 400.

Figure 31:
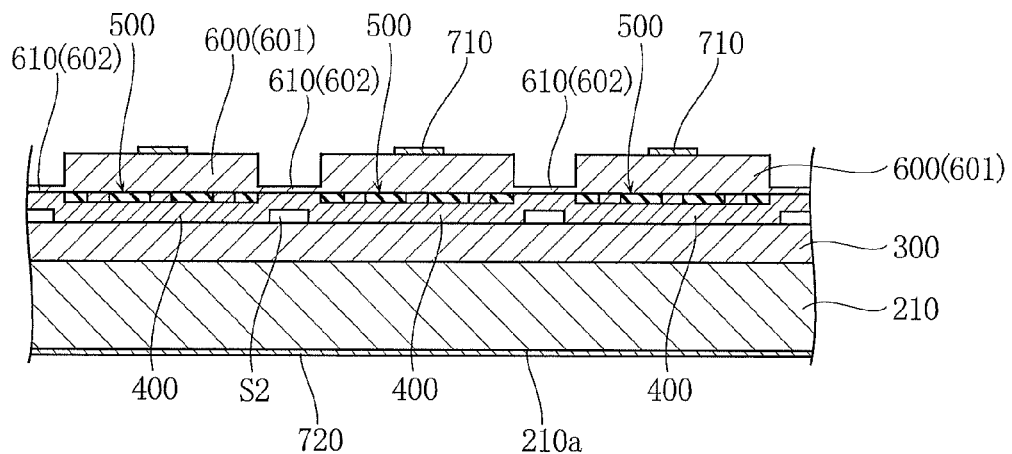
FIG. 31 is a cross-sectional view of a main section showing one process of the method for manufacturing a semiconductor light-emitting element according to the third embodiment of the present invention.

Next, as shown in FIG. 31, the back electrode 720 is formed on a back surface 210a (surface on the opposite side to the semiconductor layer side) of the support substrate 210. The back electrode 720 is formed by vapor depositing Au or a metal containing Au, for example, on the back surface 210a of the support substrate 210.

Figure 32:
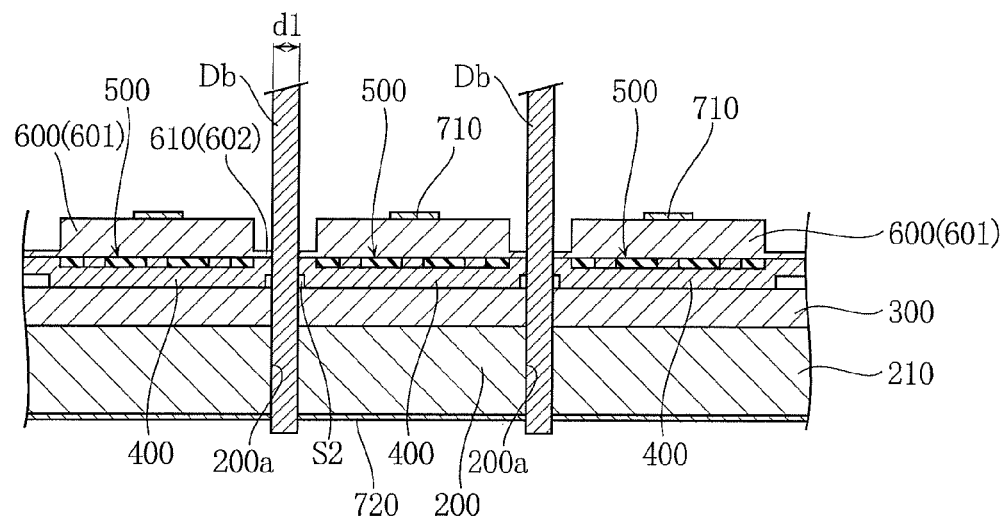
FIG. 32 is a cross-sectional view of a main section showing one process of the method for manufacturing a semiconductor light-emitting element according to the third embodiment of the present invention.

Next, as shown in FIG. 32, the first metal layer 300 and the support substrate 210 are cut. The first metal layer 300 and the support substrate 210 are cut using the dicing blade Db. Cutting is performed in the thickness direction of the support substrate 210, at positions that avoid the translucent conductive layers 500. The dicing blade Db passes through the space S2 at this time. When cutting is performed, the p-type contact layer 610 exposed in the form of a thin skin and the second metal layer 400 are also cut along with the first metal layer 300 and the support substrate 210. When the p-type contact layer 610 is cut, the thin skin-like remaining portion of the p-type contact layer 610 breaks along the end face of the semiconductor layer 600 (first semiconductor layer part 601) that is positioned thereabove. By thus cutting using the dicing blade Db, the support substrate 210 is divided into a plurality of chip-shaped substrates 200. A cut surface is formed across an entire area of the end face 200a of the substrate 200 in the thickness direction. The above enables a plurality of semiconductor light-emitting elements 103 to be manufactured.

Next, the operations and effects of the present embodiment will be described.

In the semiconductor light-emitting element 103 of the present embodiment, the end face 500a of the translucent conductive layer 500 is located more inwardly than the end face 200a of the substrate 200 as viewed in the thickness direction z. Such a configuration is realized with regard to the plurality of translucent conductive layers 500 separated from each other, by cutting at positions that avoid these translucent conductive layers 500, when cutting the support substrate 210 in the thickness direction thereof in manufacturing the semiconductor light-emitting elements 103. Accordingly, the translucent conductive layers 500 are not affected by curling up due to cutting the first and second metal layers 300 and 400 because they are not cut when forming chips by dicing. As a result, according to the present embodiment, exfoliation of the translucent conductive layers 500 when manufacturing the semiconductor light-emitting elements 103 can be appropriately prevented.

In manufacturing the semiconductor light-emitting elements 103, the recessed parts 401 are formed in portions of the second metal layer 400 that correspond to the intervals between adjacent insulating material parts 510. Thus, the spaces S2 enclosed by the first metal layer 300 and the second metal layer 400 are formed in portions where the recessed parts 401 are formed when joining the first and second metal layers 300 and 400. Accordingly, the spaces S2 function as air vents when joining the first and second metal layers 300 and 400, and the trapping of air bubbles between the first and second metal layers 300 and 400 can be avoided. This is suitable for preventing a drop in the adhesion force of the first and second metal layers 300 and 400.

In the semiconductor light-emitting element 103, the extended part 420 of the second metal layer 400 has the flange part 421 across a gap from the first metal layer 300. The end face 421a of the flange part 421 is flush with the end face 200a of the substrate 200 as viewed in the thickness direction z. Such a configuration is realized by passing the dicing blade Db through the spaces S2 formed by the recessed parts 401, in addition to cutting at positions that avoid the translucent conductive layers 500, when cutting the support substrate 210 in the thickness direction in manufacturing the semiconductor light-emitting elements 103. In the present embodiment, the thickness of the cut portion of the second metal layer 400 can be reduced by being creative with the cutting position as described above, and, as a result, the amount of Au that is cut can be substantially reduced. Accordingly, the cut resistance at the time of forming chips by dicing can be reduced, and improvement in the manufacturing efficiency of the semiconductor light-emitting elements 103 can be achieved.

Next, a fourth embodiment of the present invention will be described.

Figure 33:
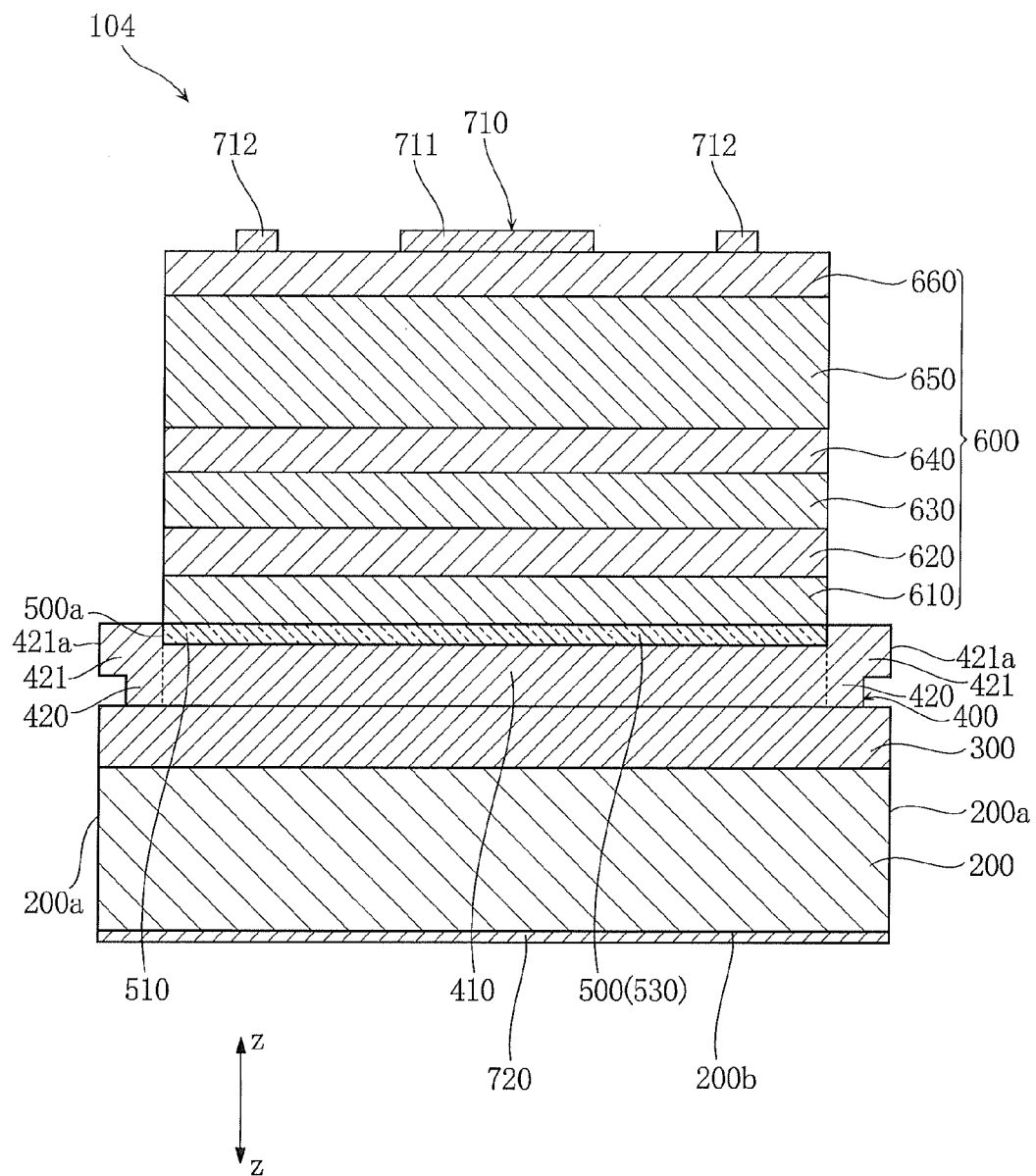
FIG. 33 is a cross-sectional view showing a semiconductor light-emitting element according to a fourth embodiment of the present invention.

FIG. 33 shows a semiconductor light-emitting element according to the fourth embodiment of the present invention. A semiconductor light-emitting element 104 of the present embodiment mainly differs from the semiconductor light-emitting element 101 of the above embodiment in terms of the configuration of the extended part 420 of the second metal layer 400.

In the semiconductor light-emitting element 104, the extended part 420 of the second metal layer 400 has a flange part 421 that protrudes outwardly as viewed in the thickness direction z of the substrate 200. The flange part 421 is located on the semiconductor layer 600 side across a gap from the first metal layer 300. In the flange part 421, an end face 421*a* that intersects a plane which is orthogonal to the thickness direction z is flush with an end face 200*a* of the substrate 200 as viewed in the thickness direction z.

Next, an exemplary method for manufacturing the semiconductor light-emitting element 104 will be described with reference to FIGS. 34A to 41.

Figure 34A:
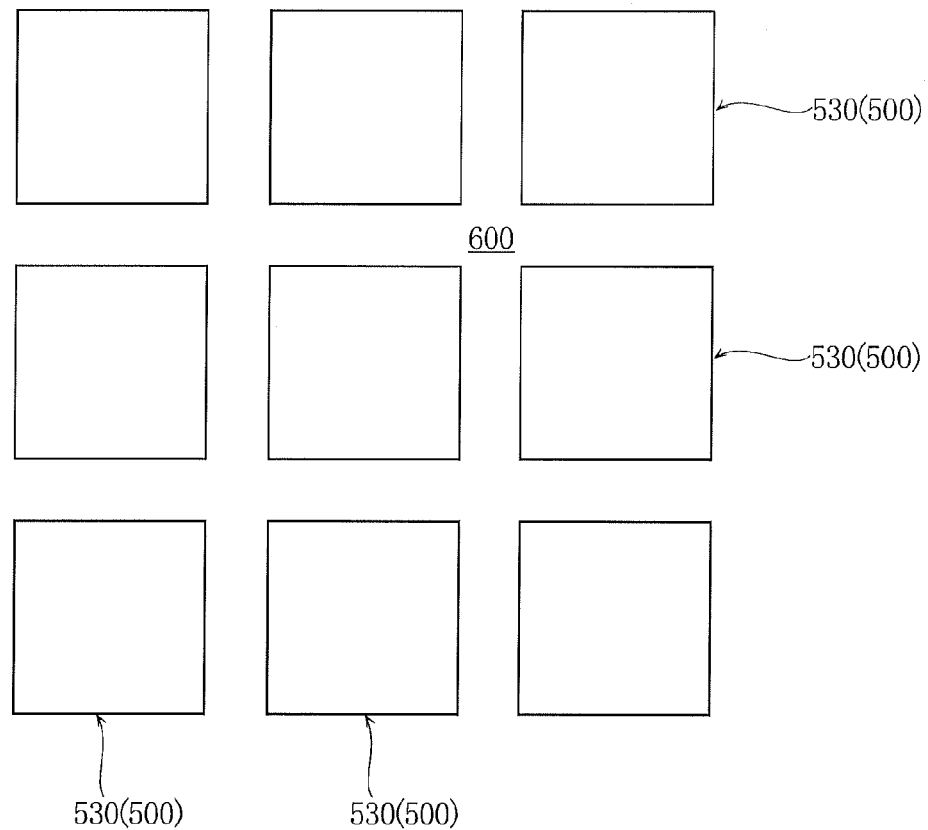
FIGS. 34A and 34B show one process of a method for manufacturing a semiconductor light-emitting element according to the fourth embodiment of the present invention, with FIG. 34A being a plan view of a main section and FIG. 34B being a cross-sectional view of a main section.
Figure 34B:
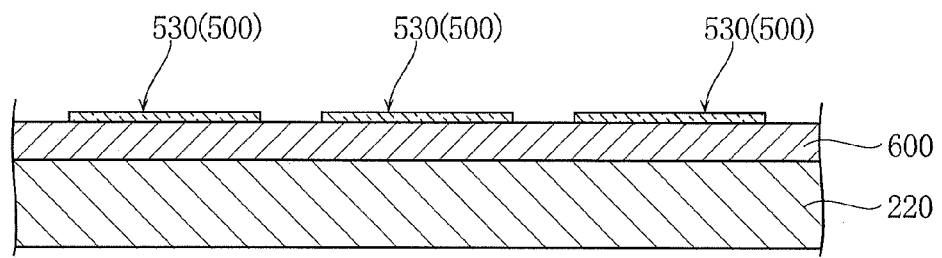

As shown in FIGS. 34A and 34B, a plurality of translucent conductive material parts 530 are formed on a semiconductor layer 600 laminated on a growth substrate 220. In forming the translucent conductive material part 530, first a translucent conductive material (e.g., ITO) having translucency and conductivity is formed as a film on the semiconductor layer 600 by a vacuum evaporation method or a sputtering method, and a translucent conductive film (not shown) is formed. Next, using a photolithographic method, a photoresist is applied onto the translucent conductive film, and exposure using a photomask having predetermined pattern shape, etching, and resist removal are sequentially performed. A plurality of translucent conductive material parts 530 (translucent conductive layers 500) are thereby formed. The plurality of translucent conductive material parts 530 have a pattern shape corresponding to the pattern of the photomask. As shown in FIG. 34A, each translucent conductive material part 530 has a rectangular shape in plan view (as viewed in the thickness direction of the growth substrate 220). The plurality of translucent conductive material parts 530 are provided at positions separated from each other on the semiconductor layer 600, and are arrayed horizontally and vertically at a fixed interval in plan view.

Figure 35:
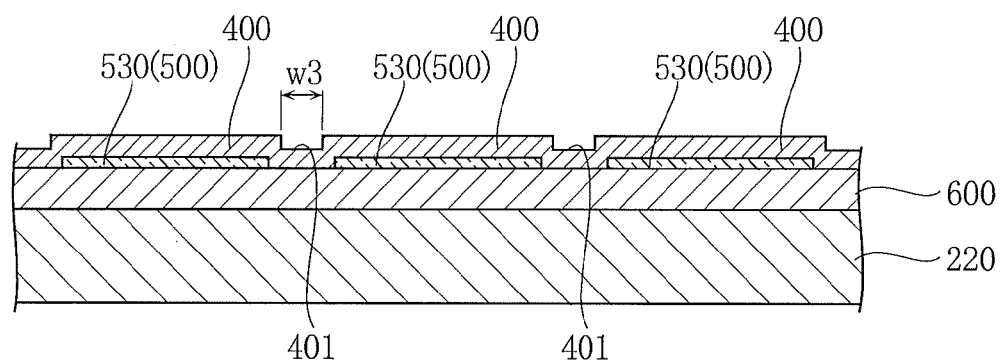
FIG. 35 is a cross-sectional view of a main section showing one process of the method for manufacturing a semiconductor light-emitting element according to the fourth embodiment of the present invention.

Next, the second metal layer 400 is formed as shown in FIG. 35. In forming the second metal layer 400, a metal material is laminated so as to entirely cover the semiconductor layer 600 and the plurality of translucent conductive material parts 530. The second metal layer 400 is formed by vapor depositing Au or a metal containing Au, for example, on the semiconductor layer 600 and on the plurality of translucent conductive material parts 530. In forming the second metal layer 400 by vapor deposition, the second metal layer 400 will have a substantially constant thickness. Recessed parts 401 are thus formed in portions of the second metal layer that correspond to the intervals between adjacent insulating material parts 510. A width dimension w3 of the recessed parts 401 is greater than the width dimension d1 (see FIG. 41) of a dicing blade Db that will be discussed later. The translucent conductive material part 530 (translucent conductive layer 500) and the semiconductor layer 600 is covered by the second metal layer 400.

Figure 36:
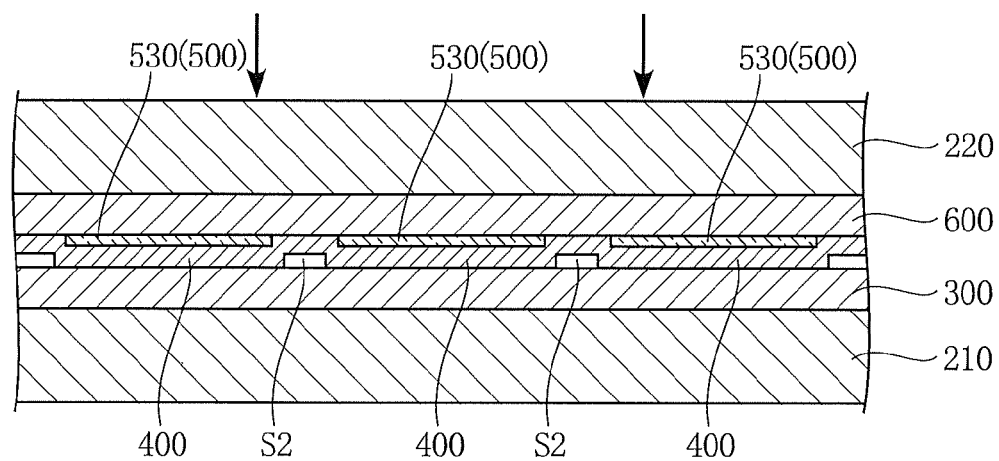
FIG. 36 is a cross-sectional view of a main section showing one process of the method for manufacturing a semiconductor light-emitting element according to the fourth embodiment of the present invention.

Next, as shown in FIG. 36, the first metal layer 300 formed on the support substrate 210 and the second metal layer 400 are stacked one on top of the other, and the first and second metal layers 300 and 400 are joined. The first metal layer 300 is formed by vapor depositing Au or a metal containing Au, for example, on a support substrate 210. The first and second metal layers 300 and 400 are joined by thermocompression bonding, for example. Here, since the recessed parts 401 are formed in the second metal layer 400, in portions where the recessed part 401 was formed, spaces S2 enclosed by the first metal layer 300 and the second metal layer 400 are formed.

Figure 37:
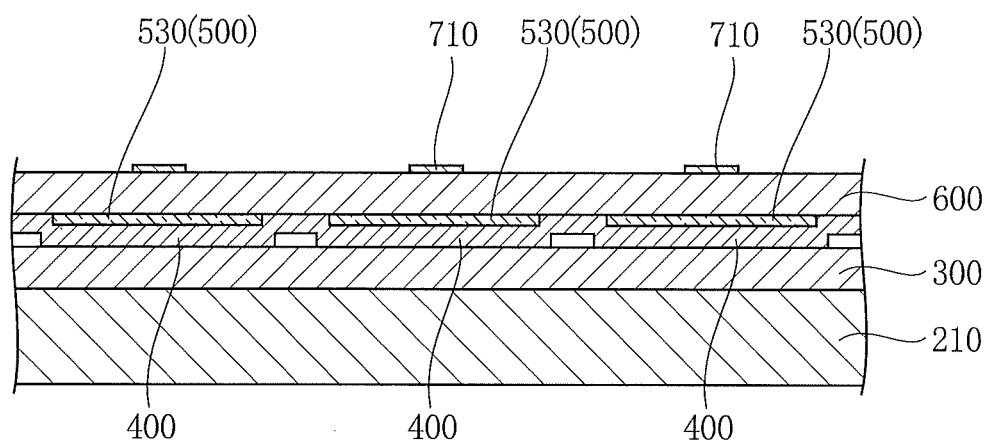
FIG. 37 is a cross-sectional view of a main section showing one process of the method for manufacturing a semiconductor light-emitting element according to the fourth embodiment of the present invention.

Next, the growth substrate 220 is removed by a wet etching technique, for example, exposing the semiconductor layer 600, and surface electrodes 710 having a predetermined shape are formed on the semiconductor layer 600, as shown in FIG. 37. The surface electrodes 710 are formed using a liftoff technique, for example.

Figure 38:
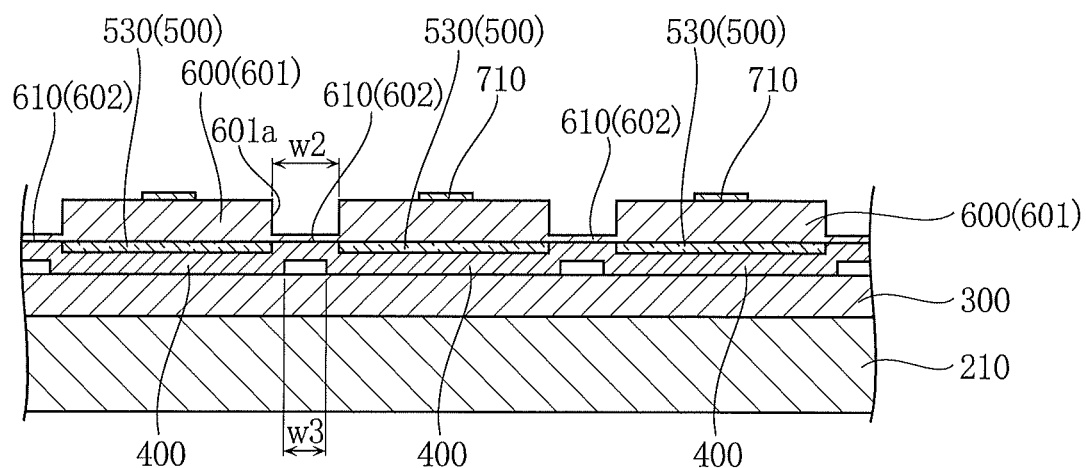
FIG. 38 is a cross-sectional view of a main section showing one process of the method for manufacturing a semiconductor light-emitting element according to the fourth embodiment of the present invention.
Figure 39:
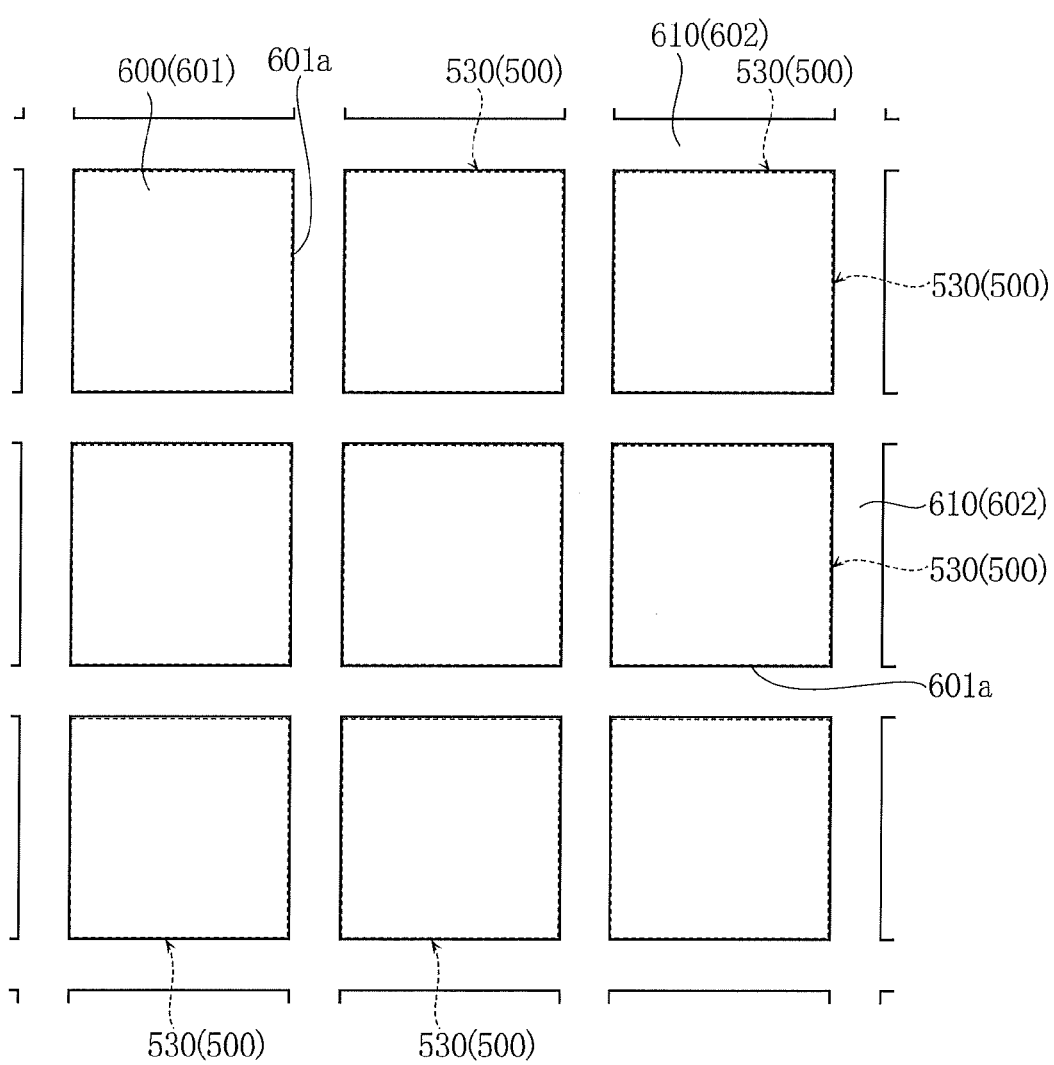
FIG. 39 is a plan view of a main section showing one process of the method for manufacturing a semiconductor light-emitting element according to the fourth embodiment of the present invention.

Next, a portion of the semiconductor layer 600 is removed, as shown in FIGS. 38 and 39. The semiconductor layer 600 is removed by a wet etching technique, for example. Portions of the semiconductor layers 600 that do not overlap with the translucent conductive layer 500 as viewed in the thickness direction of the support substrate 210 are removed. In the present embodiment, the n-type contact layer 660, the n-type window layer 650, the n-type cladding layer 640, the active layer 630, and the p-type cladding layer 620 (a detailed lamination state is not shown; first semiconductor layer part 601) of the semiconductor layer 600 are partially removed, but the p-type contact layer 610 (second semiconductor layer part 602) is not removed. The semiconductor layer 600 can be partially removed in this way using an etching solution that removes the first semiconductor layer part 601 but does not removed the second semiconductor layer part 602. Thereby, only the p-type contact layer 610 remains exposed in the form of a thin skin, without being removed by the etching solution. Note that the p-type contact layer 610 does not remain in the form of a thin skin if an etching solution for removing the p-type contact layer 610 is used. Here, grid-like groove parts 601*a* aligned horizontally and vertically are formed in the portions where the semiconductor layer 600 (first semiconductor layer part 601) has been removed, as viewed in the thickness direction of the support substrate 210. These groove parts 601*a* are formed so as to partition adjacent translucent conductive material parts 530 (translucent conductive layers 500), as viewed in the thickness direction of the support substrate 210. A width dimension w2 of the groove parts 601*a* is greater than the width dimension w3 of the recessed portions of the second metal layer 400.

Figure 40:
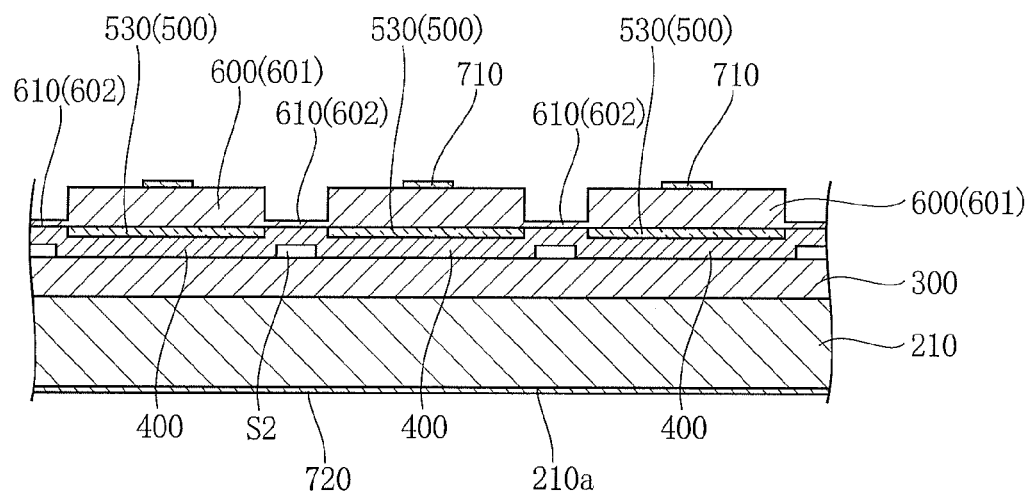
FIG. 40 is a cross-sectional view of a main section showing one process of the method for manufacturing a semiconductor light-emitting element according to the fourth embodiment of the present invention.

Next, as shown in FIG. 40, the back electrode 720 is formed on a back surface 210*a* (surface on the opposite side to the semiconductor layer side) of the support substrate 210. The back electrode 720 is formed by vapor depositing Au or a metal containing Au, for example, on the back surface 210*a* of the support substrate 210.

Figure 41:
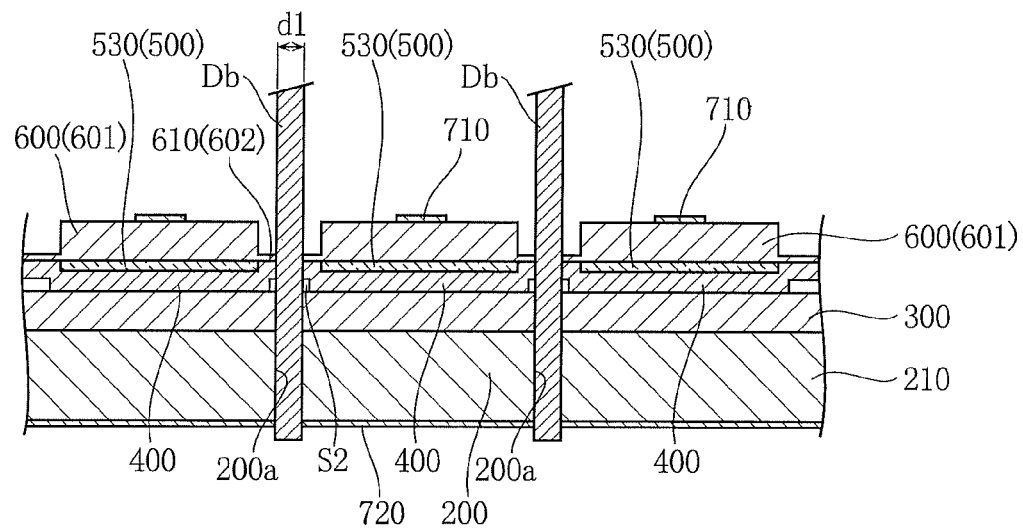
FIG. 41 is a cross-sectional view of a main section showing one process of the method for manufacturing a semiconductor light-emitting element according to the fourth embodiment of the present invention.

Next, as shown in FIG. 41, the first metal layer 300 and the support substrate 210 are cut. The first metal layer 300 and the support substrate 210 are cut using the dicing blade Db. Cutting is performed in the thickness direction of the support substrate 210, at positions that avoid the translucent conductive material parts 530 (translucent conductive layers 500). The dicing blade Db passes through the space S2 at this time. When cutting is performed, the p-type contact layer 610 exposed in the form of a thin skin and the second metal layer 400 are also cut along with the first metal layer 300 and the support substrate 210. When the p-type contact layer 610 is cut, the thin skin-like remaining portion of the p-type contact layer 610 breaks along the end face of the semiconductor layer 600 (first semiconductor layer part 601) that is positioned thereabove. By thus cutting using the dicing blade Db, the support substrate 210 is divided into a plurality of chip-shaped substrates 200. A cut surface is formed across an entire area of the end face 200a of the substrate 200 in the thickness direction. The above enables a plurality of semiconductor light-emitting elements 103 to be manufactured.

Next, the operations and effects of the present embodiment will be described.

In the semiconductor light-emitting element 104 of the present embodiment, the end face 500a of the translucent conductive layer 500 is located more inwardly than the end face 200a of the substrate 200 as viewed in the thickness direction z. Such a configuration is realized with regard to the plurality of translucent conductive layers 500 separated from each other, by cutting at positions that avoid these translucent conductive layers 500, when cutting the support substrate 210 in the thickness direction thereof in manufacturing the semiconductor light-emitting elements 104. Accordingly, the translucent conductive layers 500 are not affected by curling up due to cutting the first and second metal layers 300 and 400 because they are not cut when forming chips by dicing. As a result, according to the present embodiment, exfoliation of the translucent conductive layers 500 when manufacturing the semiconductor light-emitting elements 104 can be appropriately prevented.

In manufacturing the semiconductor light-emitting elements 104, the recessed parts 401 are formed in portions of the second metal layer 400 that correspond to the intervals between adjacent translucent conductive material parts 530 (translucent conductive layers 500). Thus, the spaces S2 enclosed by the first metal layer 300 and the second metal layer 400 are formed in portions where the recessed parts 401 are formed when joining the first and second metal layers 300 and 400. Accordingly, the spaces S2 function as air vents when joining the first and second metal layers 300 and 400, and the trapping of air bubbles between the first and second metal layers 300 and 400 can be avoided. This is suitable for preventing a drop in the adhesion force of the first and second metal layers 300 and 400.

In the semiconductor light-emitting element 104, the extended part 420 of the second metal layer 400 has the flange part 421 across a gap from the first metal layer 300. The end face 421a of the flange part 421 is flush with the end face 200a of the substrate 200 as viewed in the thickness direction z. Such a configuration is realized by passing the dicing blade Db through the spaces S2 formed by the recessed parts 401, in addition to cutting at positions that avoid the translucent conductive layers 500, when cutting the support substrate 210 in the thickness direction in manufacturing the semiconductor light-emitting elements 104. In the present embodiment, the thickness of the cut portion of the second metal layer 400 can be reduced by being creative with the cutting position as described above, and, as a result, the amount of Au that is cut can be substantially reduced. Accordingly, the cut resistance at the time of forming chips by dicing can be reduced, and improvement in the manufacturing efficiency of the semiconductor light-emitting elements 104 can be achieved.

Next, a fifth embodiment of the present invention will be described.

Figure 42:
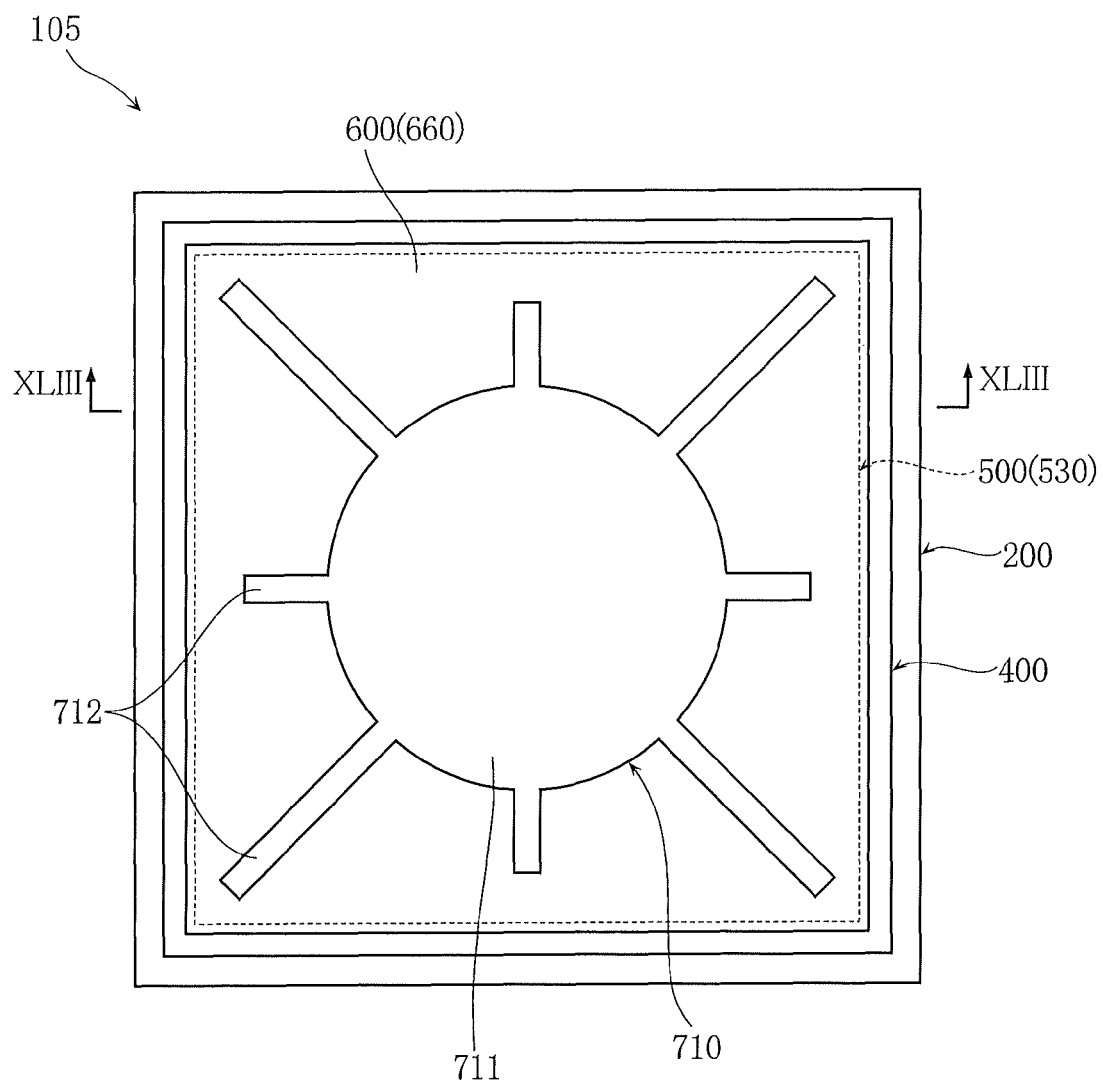
FIG. 42 is a plan view showing a semiconductor light-emitting element according to a fifth embodiment of the present invention.
Figure 43:
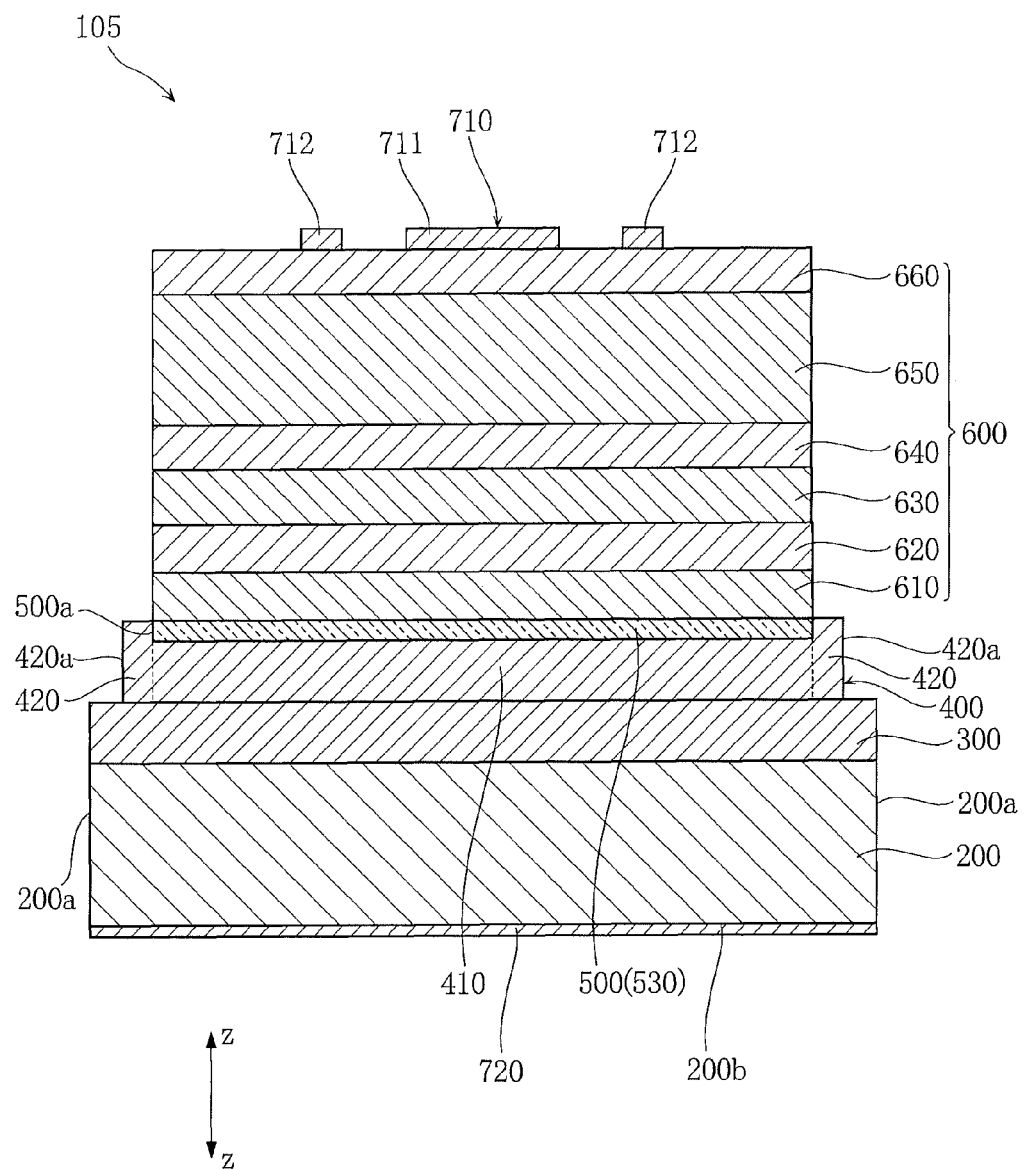
FIG. 43 is a cross-sectional view along a line XLIII-XLIII in FIG. 42.

FIGS. 42 and 43 show a semiconductor light-emitting element according to the fifth embodiment of the present invention. The semiconductor light-emitting element 105 of the present embodiment differs from the semiconductor light-emitting element 102 of the above embodiment in terms of the shape of the surface electrode 710.

In the semiconductor light-emitting element 105, the surface electrode 710 has a circular center electrode part 711 located in the center on an n-type contact layer 660 (semiconductor layer 600) as viewed in the thickness direction z, and linear electrode parts 712 that extend radially from the center electrode part 711. The percentage of the area of the semiconductor layer 600 that is occupied by the surface electrode 710 is about 24% to 28%, for example. According to such a configuration, comparatively high intensity properties can be realized, while relatively reducing the size of the semiconductor light-emitting element 105.

A semiconductor light-emitting elements according to the present invention and a manufacturing method for the same are not limited to the abovementioned embodiments. Various design changes can be freely made to the specific configurations of the constituent elements of a semiconductor light-emitting element according to the present invention and a manufacturing method for the same.

The invention claimed is:

1. A semiconductor light-emitting element comprising:
   a substrate;
   a first metal layer supported by the substrate;
   a second metal layer supported by the substrate;
   a translucent conductive layer supported by the substrate; and
   a semiconductor layer supported by the substrate and including a light-emitting region;
   wherein the translucent conductive layer includes an end face that intersects a plane orthogonal to a thickness direction of the substrate,
   the substrate includes an end face that intersects a plane orthogonal to the thickness direction,
   the semiconductor layer includes an end face that intersects a plane orthogonal to the thickness direction, the end face of the translucent conductive layer being flush with the end face of the semiconductor layer, and
   the end face of the translucent conductive layer is located inwardly of the end face of the substrate as viewed in the thickness direction.

2. The semiconductor light-emitting element according to claim 1, wherein the second metal layer includes a laminated part and an extended part, the laminated part being configured to overlap with the translucent conductive layer as viewed in the thickness direction, the extended part being connected to an outer peripheral portion of the laminated part and extending toward the translucent conductive layer in the thickness direction, and
   wherein the end face of the translucent conductive layer is covered by the extended part.

3. The semiconductor light-emitting element according to claim 2, wherein an outer peripheral surface of the extended part is located inwardly of the end face of the substrate as viewed in the thickness direction.

4. The semiconductor light-emitting element according to claim 3, wherein the outer peripheral surface of the extended part is flat in the thickness direction.

5. The semiconductor light-emitting element according to claim 2, wherein the extended part includes a flange part spaced apart from the first metal layer and offset toward the semiconductor layer, and wherein the flange part includes an end face that intersects a plane orthogonal to the thickness direction, and the end face of the flange part is flush with the end face of the substrate as viewed in the thickness direction.

6. The semiconductor light-emitting element according to claim 1, wherein the translucent conductive layer includes an insulating material part and a metal material part, the insulating material part having translucency and no conductivity, the metal material part having conductivity and no translucency and being surrounded by the insulating material part as viewed in the thickness direction to pass through in the thickness direction.

7. The semiconductor light-emitting element according to claim 1, wherein the translucent conductive layer is made up of a single translucent conductive material part.

8. The semiconductor light-emitting element according to claim 1, wherein each of the first metal layer and the second metal layer contains Au.

9. The semiconductor light-emitting element according to claim 1, wherein the end face of the translucent conductive layer and the end face of the substrate are each rectangular as viewed in the thickness direction.

10. The semiconductor light-emitting element according to claim 9, wherein the end face of the substrate is constituted by a cut surface formed across an entire area of the end face in the thickness direction.

11. The semiconductor light-emitting element according to claim 1, further comprising a surface electrode provided on the semiconductor layer.

12. The semiconductor light-emitting element according to claim 11, wherein the substrate includes a back surface opposite to the semiconductor layer and provided with a back electrode in conduction with the semiconductor layer via the translucent conductive layer.

* * * * *